(12) United States Patent
Masuda et al.

(10) Patent No.: US 8,212,615 B2
(45) Date of Patent: Jul. 3, 2012

(54) VARIABLE-GAIN AMPLIFIER CIRCUIT AND WIRELESS COMMUNICATION DEVICE INTEGRATED CIRCUIT EQUIPPED THEREWITH

(75) Inventors: Toru Masuda, Kokubunji (JP);
Nobuhiro Shiramizu, Musashino (JP);
Takahiro Nakamura, Kodaira (JP);
Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 12/765,010

(22) Filed: Apr. 22, 2010

(65) Prior Publication Data

US 2010/0271122 A1    Oct. 28, 2010

(30) Foreign Application Priority Data

Apr. 27, 2009    (JP) ................................. 2009-107673

(51) Int. Cl.
*H03F 3/45*    (2006.01)
*H03F 3/191*    (2006.01)

(52) U.S. Cl. ....................................... 330/254; 330/305

(58) Field of Classification Search .................. 330/254, 330/302, 305
See application file for complete search history.

(56) References Cited

U.S. PATENT DOCUMENTS

| 6,121,825 | A | * | 9/2000 | Ko et al. | ......................... 327/553 |
| 7,282,993 | B2 | | 10/2007 | Okamoto | |
| 7,400,203 | B2 | * | 7/2008 | Ojo et al. | ......................... 330/305 |

FOREIGN PATENT DOCUMENTS

| JP | 2000-036564 A | 2/2000 |
| JP | 2004-304330 A | 10/2004 |
| JP | 2007-189569 A | 7/2007 |

* cited by examiner

*Primary Examiner* — Steven J Mottola
(74) *Attorney, Agent, or Firm* — Miles & Stockbridge P.C.

(57) ABSTRACT

There is disclosed a variable-gain amplifier circuit that operates on a low voltage, exhibits low distortion, provides a wide range of variation, and is suitable for use in a low-power-consumption wireless communication system. The variable-gain amplifier circuit is configured so that a variable-load circuit, which includes three reactance function elements and provides a wide range of impedance variation, is connected to a conductor circuit whose output terminal generates a positive-phase output current proportional to conductance with respect to an input voltage.

14 Claims, 19 Drawing Sheets

L1=0.55 nH
L1 SERIAL PARASITIC RESISTANCE r1=3Ω
L2=0.55 nH
L2 SERIAL PARASITIC RESISTANCE r2=3Ω
C1=40 fF, 80 fF (TWO VALUES)

L1=0.35 to 1.15 nH
L1 SERIAL PARASITIC RESISTANCE r1=3Ω
L2=0.35 to 1.15 nH
L2 SERIAL PARASITIC RESISTANCE r2=3Ω
C1=40 fF

L1=0.55 nH
L1 SERIAL PARASITIC RESISTANCE r1=3Ω
C1=3 fF, 80 fF (TWO VALUES)
C2=80 fF

FIG. 9
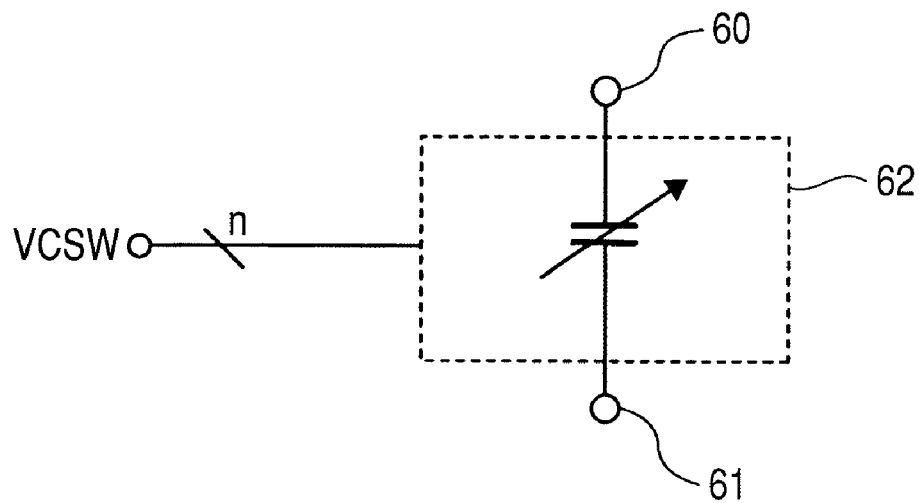
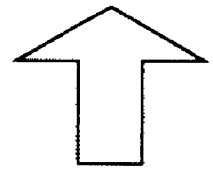
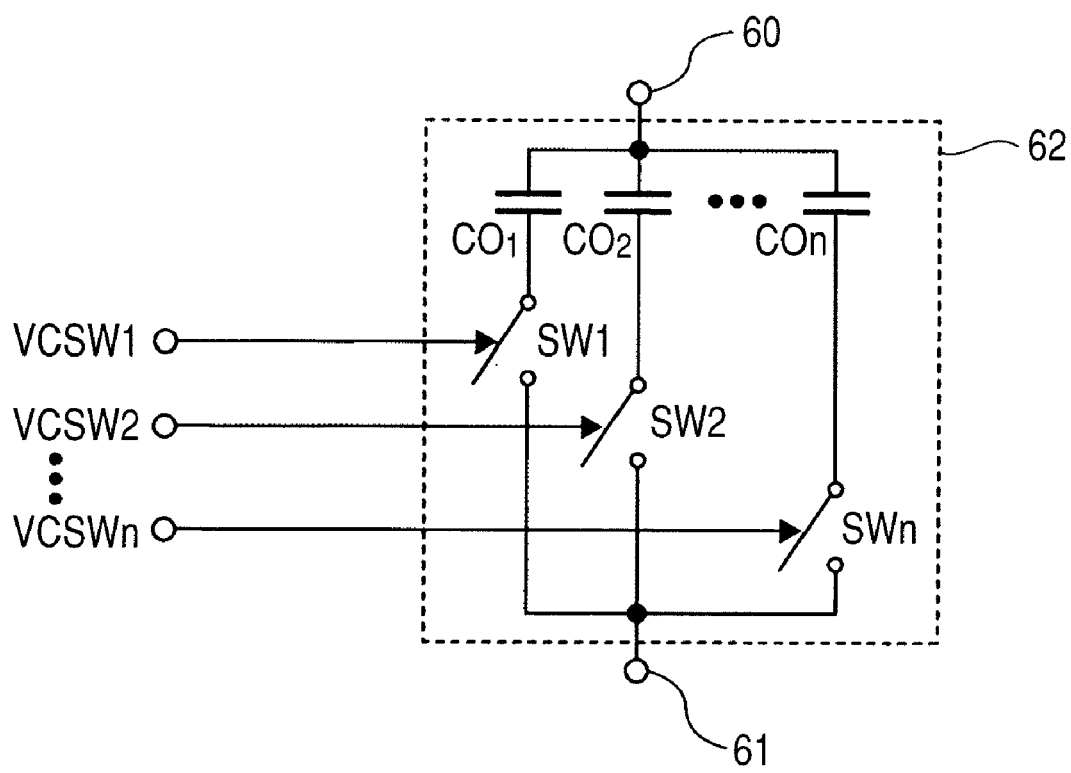

FIG. 10
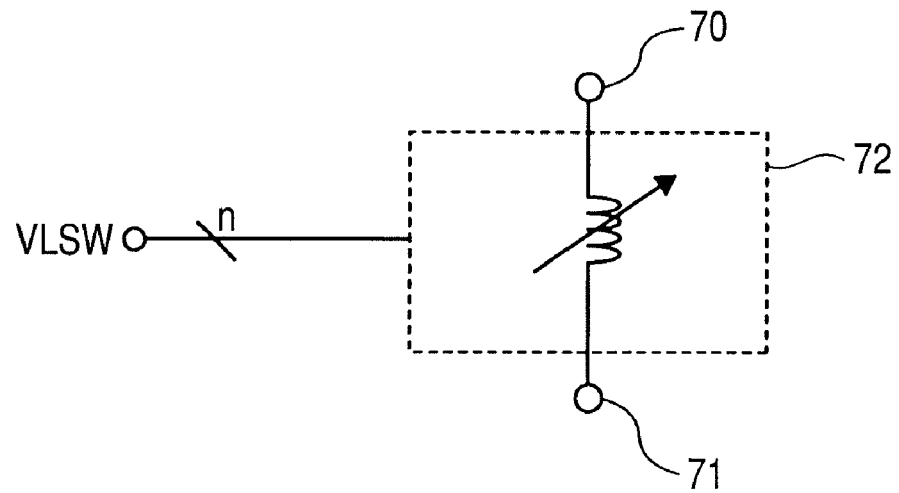
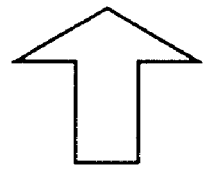
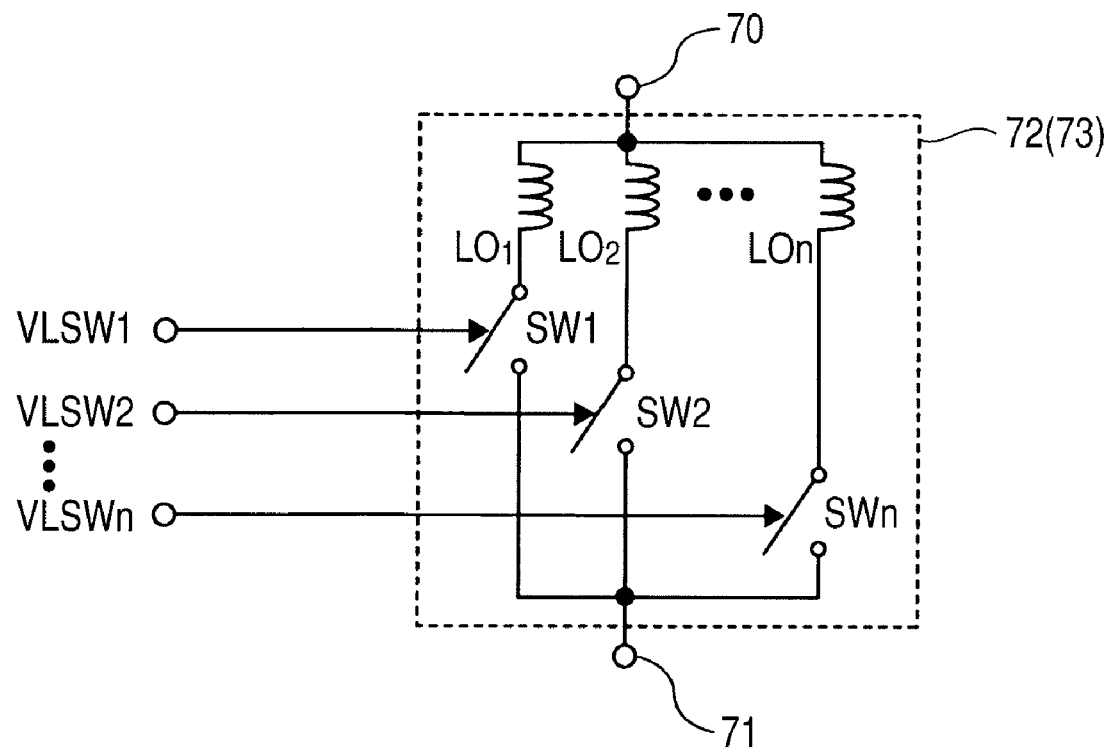

FIG. 11
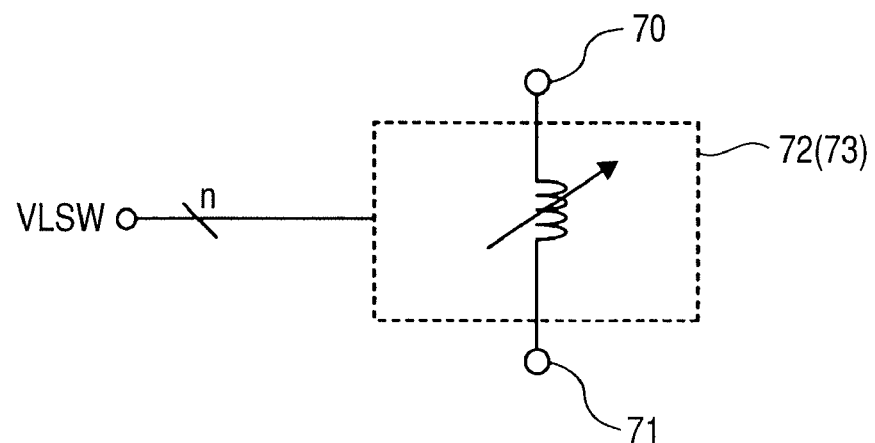
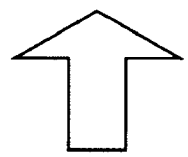
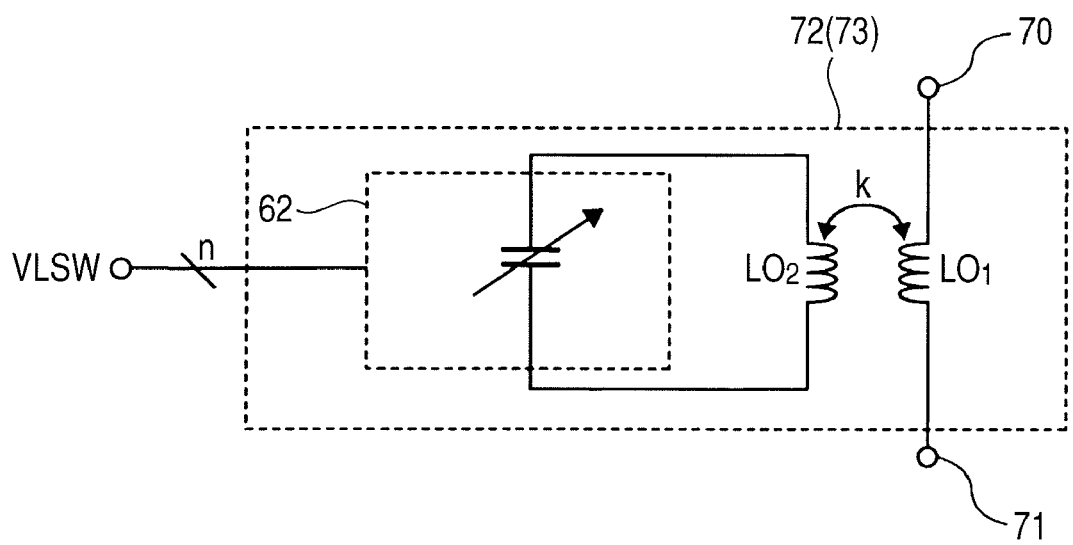

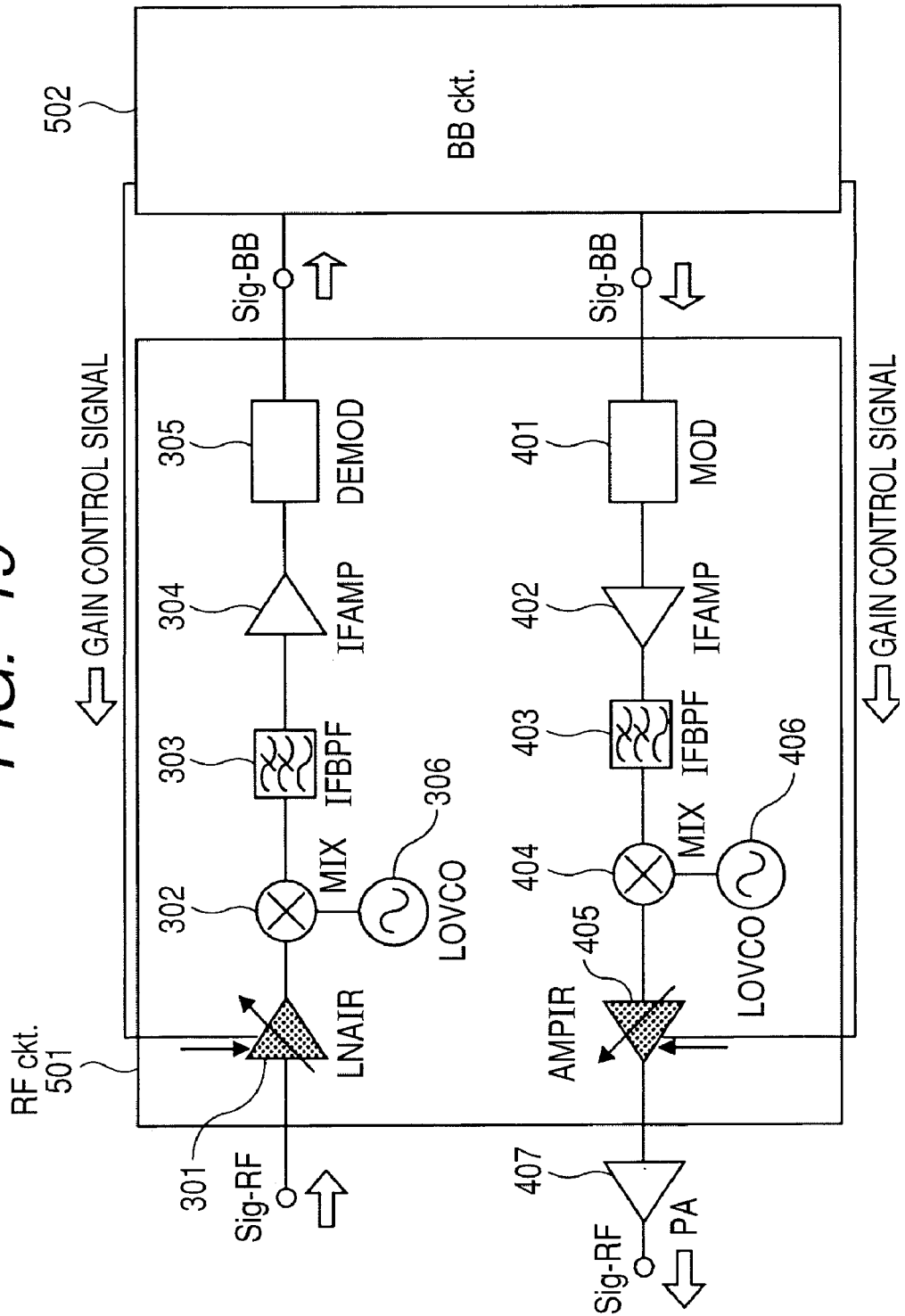

VARIABLE-GAIN AMPLIFIER CIRCUIT AND WIRELESS COMMUNICATION DEVICE INTEGRATED CIRCUIT EQUIPPED THEREWITH

CLAIM OF PRIORITY

The present application claims priority from Japanese Patent Application JP 2009-107673 filed on Apr. 27, 2009, the content of which is hereby incorporated by reference into this application.

FIELD OF THE INVENTION

The present invention relates to a variable-gain amplifier circuit and a wireless communication device integrated circuit equipped with the variable-gain amplifier circuit. More specifically, the present invention relates to a technology effective for a wireless communication circuit forming a wireless communication system whose signal level varies over a wide range.

BACKGROUND OF THE INVENTION

Studies conducted by the inventor of the present invention have revealed that technologies concerning a wireless communication circuit forming a wireless communication system are described, for instance, in Japanese Patent Application Laid-Open Publication No. 2007-189569, Japanese Patent Application Laid-Open Publication No. 2004-304330, and Japanese Patent Application Laid-Open Publication No. 2000-36564.

Japanese Patent Application Laid-Open publication No. 2007-189569 describes a unit that implements a variable-gain amplifier while input impedance matching is achieved. Four cascode transistors (the first to fourth cascode transistors) are selectively operated to form a variable-gain amplifier that distributes a current flowing in a load circuit. A load circuit for an output node is formed by a parallel resonance circuit which includes a first inductor and a first capacitor, and a serial resonance circuit which includes a second inductor, a second capacitor and a first resistor.

Japanese Patent Application Laid-Open Publication No. 2004-304330 describes an amplifier circuit capable of varying the frequency response of an input signal and a semiconductor integrated circuit device having such an amplifier circuit. From a power supply potential wiring to a ground potential wiring, a first inductor, a first resistor, a first output terminal, and a first transistor are series-connected in the order named, and in parallel with these, a second inductor, a second resistor, a second output terminal, and a second transistor are series-connected in the order named. Further, a first variable capacitor is connected to a connection point between the first inductor and the first resistor with a second variable capacitor connected to a connection point between the second inductor and the second resistor to form a variable-resonance-frequency load circuit.

Japanese Patent Application Laid-Open Publication No. 2000-36564 describes a variable resistor, which is used, for instance, as an attenuator for a high-frequency input signal, and a variable gain circuit, which outputs, for instance, a harmonic input signal after amplifying it by a desired gain. A first inductor is connected between a drain terminal and a source terminal of a first field-effect transistor in which the resistance values of the drain terminal and source terminal vary with a control voltage input to a gate terminal of the first field-effect transistor. As for a DC signal, the first inductor forms a short circuit between the drain terminal and source terminal to reduce the potential difference to zero. As for a high-frequency signal, the first inductor indicates an impedance in accordance with the frequency of the signal. The field-effect transistor and the inductor form a parallel circuit to provide variable resistance.

SUMMARY OF THE INVENTION

The following findings are obtained from studies that have been conducted by the inventor of the present invention to investigate the above-described wireless communication circuit forming a wireless communication system.

A wireless communication amplifier has been developed as an essential constituent element for a wireless communication device. The development of such an amplifier is driven by a wide variety of applications, including mobile phone wireless communication devices such as a GSM (Global System for Mobile communications), a PDC (Personal Digital Cellular), a PHS (Personal Handy-phone System), and a PCS (Personal Communication Services), wireless communication devices forming a wireless LAN compliant with the 802.11a, 802.11b, and 802.11g IEEE wireless communication standards, wireless MANs (Metropolitan Area Networks), and millimeter-wave wireless PANs (Personal Area Networks) capable of providing high data rate wireless communication. The upper-limit frequencies used for such applications range from a quasi-millimeter wave band to a millimeter wave band.

It is constantly demanded that these wireless communication devices be low-priced and small-sized for widespread use and low in power consumption for long-term operations. Two measures have been taken to achieve low power consumption. More specifically, the power consumption has been reduced by decreasing the electrical current consumption and by lowering the supply voltage. To lower the supply voltage, it is necessary to decrease the voltage to be applied to an active element and minimize the voltage drop, for instance, in a resistive element. At present, it is expected that the circuit configuration be improved to implement a wireless communication device operable on low voltage.

Although various configurations are proposed for a wireless communication system, its receiver needs to incorporate a variable-gain function for adjusting the value of input signal power to a signal level that can be readily handled by a subsequent circuit. Further, it is essential that its transmitter incorporate a variable-gain function because it needs to adjust the value of transmission power in accordance with a radio wave environment. For a present-day wireless communication system, therefore, it is absolutely necessary to develop an amplifier circuit that implements an adequate variable-gain function while being operable on low voltage.

In view of the above circumstances, problems with the related art concerning a variable-gain amplifier circuit are described below.

The unit described in Japanese Patent Application Laid-Open Publication No. 2007-189569 is a variable-gain amplifier that selectively operates four cascode transistors (the first to fourth cascode transistors) to distribute a current flowing in a load circuit. However, it is necessary to obtain a bias voltage for operating the cascode transistors. Therefore, a predetermined bias voltage cannot be obtained for a low-voltage operation. This will cause performance deterioration, for instance, to decrease the degree of amplification.

The known prior art described in Japanese Patent Application Laid-Open Publication No. 2004-304330 relates to the use of a resonance load circuit having two elements, namely, an inductor and a variable capacitor. When high frequencies in a microwave band or millimeter wave band are handled, however, the influence of parasitic resistance arising in the inductor and capacitor increases. Therefore, a resonance circuit having a low quality factor results. Thus, deterioration occurs, for instance, to reduce the variability of frequency response. Further, an observation of the impedance of the resonance load circuit at a specific frequency reveals that a small change occurs in the impedance of the resonance load circuit when a resonance frequency is changed. Consequently, when this known variable resonance circuit is used, the range of gain variation narrows as the range of load variation is small at high frequencies.

The variable resistor described in Japanese Patent Application Laid-Open Publication No. 2000-36564 operates within a limited range of input signal amplitude as the linear resistance region of a field-effect transistor is used. Therefore, linearity deterioration may occur to degrade the distortion characteristic of an amplifier circuit.

Referring now to FIGS. 20A and 20B, a typical configuration of a conventional variable load circuit and a problem with such a conventional variable load circuit will be described. FIG. 20A shows a variable load circuit 3 comprising a parallel circuit having an inductor L1 and a variable capacitor C1, and an input terminal 31. In consideration of a serial parasitic resistance r1 (3 ohms) in the inductor L1, which is not shown, the following calculations are performed. In the example shown in FIG. 20A, the quality factor of the inductor L1 is approximately 20 at a frequency of 24 GHz or so. An appropriate value achievable by a present-day integrated circuit is selected.

As the inductor cannot serve as a DC current path, this load has a bias function and an AC load function. FIG. 20B shows the frequency dependence of this conventional variable load circuit. The resonance frequency varies with variable capacitance. When, for instance, the capacitance C1 is changed to 160 fF and 80 fF, impedances of 2300Ω and 82Ω are respectively obtained at 24 GHz, which is of interest. The ratio between these two impedances is approximately 28 times. In the case of FIG. 20B, the impedance can be changed approximately 28 times (by approximately 15 dB) at 24 GHz when the resonance frequency varies with the variable capacitance. When a passive element is used as a constituent as described above, it can be expected that a low distortion characteristic will prevail. In addition, the inductor serves as a DC path. It means that the voltage drop by a bias current can be reduced. Thus, a low-voltage operation can be performed. However, the range of gain variation is as small as approximately 28 times. To provide a wide range of gain variation, therefore, it is necessary to use a multi-stage amplifier circuit based on a conventional variable-load circuit. This causes a problem because such a multi-stage amplifier circuit occupies a large area of a chip.

The present invention has been made in view of the above circumstances to address the problems found in Japanese Patent Application Laid-Open Publication Nos. 2007-189569, 2004-304330 and 2000-36564, and provides an amplifier circuit that serves as an essential element of a present-day wireless communication system and implements an adequate variable-gain function while being operable on a low voltage. In other words, the present invention provides a technology that supports the quasi-millimeter wave band and millimeter wave band, which are higher in frequency than the microwave band, and provides a wide gain variation range even at a low operating voltage while accepting a wide range of input signal power.

More specifically, the present invention provides an amplifier circuit that has a wide dynamic range and is operable on low voltage, and also provides a wireless communication device integrated circuit with such an amplifier circuit.

Novel features and advantages of the present invention, in addition to those mentioned above, will become apparent from a reading of the following description in conjunction with the accompanying drawings.

The following is a brief description of a representative aspect of the invention disclosed in the present application.

According to a representative aspect of the present invention, there is provided an amplifier circuit including: an input matching circuit that generates a predetermined matching impedance for a preceding output impedance; a conductor circuit that outputs a current proportional to conductance with respect to an input voltage applied through the input matching circuit and a voltage generated between a reference voltage terminal and the conductor circuit; at least one variable-load circuit that is capable of converting an input current applied to the conductor circuit to a voltage signal and controlling a conversion factor for the current-to-voltage conversion; an output matching circuit that is connected to the variable-load circuit to generate a predetermined matching impedance for a succeeding input impedance; and a stabilization circuit that is connected to the variable-load circuit to cause resistive power loss within a specific frequency range; wherein the variable-load circuit includes three reactance function elements, at least one of the three reactance function elements being capable of changing a reactance value; and wherein an input terminal of the input matching circuit is used as an input terminal while an output terminal of the output matching circuit is used as an output terminal.

The following is a brief description of an effect achievable by a representative aspect of the invention disclosed in the present application. The present invention provides an amplifier circuit that operates at a voltage lower than previously required to implement a variable-gain function, offers a wide gain variation range, and assures a low-distortion operation. The present invention also provides a wireless communication device integrated circuit that uses the above amplifier circuit.

BRIEF DESCRIPTION OF THE DRAWINGS

Embodiments of the present invention will be described in detail based on the following figures, wherein:

FIG. 9 shows the configuration of an integratable variable capacitor used in each embodiment of the present invention;

FIG. 10 shows a first configuration of an integratable variable inductor used in each embodiment of the present invention;

FIG. 11 shows a second configuration of the integratable variable inductor used in each embodiment of the present invention;

FIG. 19 is a diagram illustrating a typical configuration of a wireless communication RFIC to which an amplifier circuit according to an embodiment of the present invention is applied;

DETAILED DESCRIPTION OF THE PREFERRED EMBODIMENTS

Figure 1:
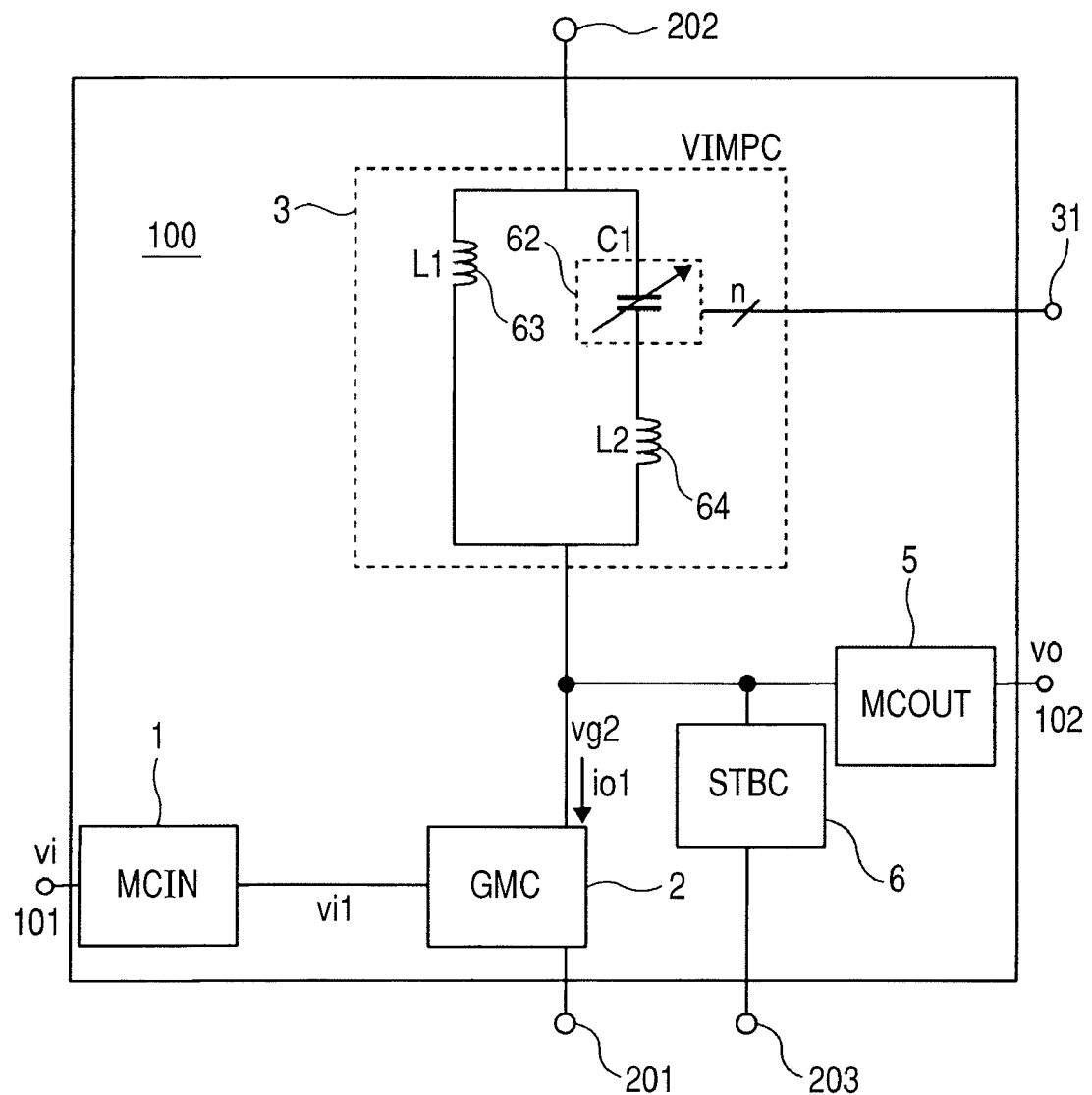
FIG. 1 is a diagram illustrating the configuration of a variable-gain amplifier circuit formed on a semiconductor chip of a semiconductor integrated circuit according to a first embodiment of the present invention.

A variable-gain amplifier circuit according to embodiments of the present invention will now be described in detail with reference to the accompanying drawings.
First Embodiment A first embodiment of the present invention is described below with reference to FIGS. 1, 2A, and 2B. FIG. 1 is a diagram illustrating the configuration of a variable-gain amplifier circuit according to an embodiment of the present invention. The variable-gain amplifier circuit (hereinafter simply referred to as the amplifier circuit) 100 shown in FIG. 1 includes an input matching circuit 1 (MCIN), a conductor circuit 2 (GMC), a variable-load circuit 3 (VIMPC), an output matching circuit 5 (MCOUT), and a stabilization circuit 6 (STBC). More specifically, the amplifier circuit 100 includes the input matching circuit 1 (MCIN), which generates a predetermined matching impedance for an output impedance of a preceding stage; the conductor circuit 2 (GMC), which outputs a current proportional to conductance with respect to an input voltage applied through the input matching circuit and a voltage generated between a reference voltage terminal and the conductor circuit; the variable-load circuit 3 (VIMPC), which is capable of converting an input current applied to the conductor circuit to a voltage signal and controlling a conversion factor for the current-to-voltage conversion; the output matching circuit 5 (MCOUT), which is connected to the variable-load circuit to generate a predetermined matching impedance for an input impedance of a succeeding stage; and the stabilization circuit 6 (STBC), which is connected to the variable-load circuit to cause resistive power loss within a specific frequency range. The variable-load circuit 3 includes three reactance function elements C1, L1, L2, namely, a variable capacitor C1, a first inductor L1 and a second inductor L2. The reactance function element C1 is capable of changing a reactance value. An input terminal of the input matching circuit to which a voltage signal vi is applied is used as an input terminal 101. An output terminal of the output matching circuit is used as an output terminal 102 from which an output voltage vo is output. The reference numeral 201 denotes a low constant voltage power supply terminal. The reference numeral 202 denotes a high constant voltage power supply terminal. The reference numeral 203 denotes a DC voltage application terminal.

The input matching circuit 1 is a circuit network that determines the degree of matching relative to a preceding drive impedance Zs of the amplifier circuit 100. The degree of matching depends on the use of the amplifier circuit. When the amplifier circuit is used as a low noise amplifier circuit, setup is performed so that output noise is not higher than a predetermined value. When, on the other hand, the amplifier circuit is used as a power amplifier circuit, setup is performed so that power transmission efficiency is not lower than a predetermined value. Even when the amplifier circuit is used as a low noise amplifier circuit, setup may be performed to establish an intermediate matching state for the purpose of satisfying predetermined characteristic values of both low noise and power amplification. In the scope of the present invention, the input matching circuit 1 is handled as a matching circuit that satisfies the performance requirements of the amplifier circuit 100.

The conductor circuit 2 (GMC) is a circuit network that generates an output current signal io1 at an output terminal. The output current signal io1 is proportional to the potential difference between a voltage signal vi1 applied to an input terminal and a voltage Vg2 present at a reference terminal.

The input impedance of the conductor circuit 2 varies with its configuration, bias current, and various other conditions.

The variable-load circuit 3 (VIMPC) includes three reactance function elements, namely, the variable capacitor C1 (a capacitor 62 having a variable capacitance value), the first inductor L1 (an inductor 63 having a fixed value), and the second inductor L2 (an inductor 64 having a fixed value). The variable-load circuit 3 is positioned between the conductor circuit 2 and the high constant voltage power supply terminal 202 and capable of receiving an output current io1 of the conductor circuit 2 and converting it to a voltage signal vg2. The variable-load circuit 3 is capable of controlling its impedance value and frequency dependence in accordance with a control voltage that is given from a variable control terminal 31 to the capacitor 62 having a variable capacitance value.

The output matching circuit 5 (MCOUT) is a circuit network that determines the degree of matching relative to a load impedance ZL subsequent to the amplifier circuit 100.

The stabilization circuit 6 (STBC) is a functional circuit that provides circuit stabilization within a specific frequency band. More specifically, the stabilization circuit 6 causes resistive loss within the specific frequency band to reduce the risk of parasitic oscillation.

As the variable-load circuit 3 is positioned toward the load side of the conductor circuit 2, a variable-gain function is implemented when the variable-load circuit 3 is controlled for two different impedances (high impedance and low impedance) at a frequency of interest (e.g., 24 GHz).

The variable-gain amplifier circuit according to the first embodiment of the present invention is characterized in that the variable-load circuit 3, which includes three reactance function elements, is employed while at least one of the three reactance function elements is a variable capacitor. The three function elements constituting the variable-load circuit 3 according to the first embodiment can generate a local minimum point in the frequency dependence of impedance because they include one variable-capacitance element (C1) 62 and two fixed-inductance elements (L1, L2) 63, 64, and have a parallel connection structure between a C1-L2 series connection circuit and the fixed-inductance element L1.

Figure 2A:
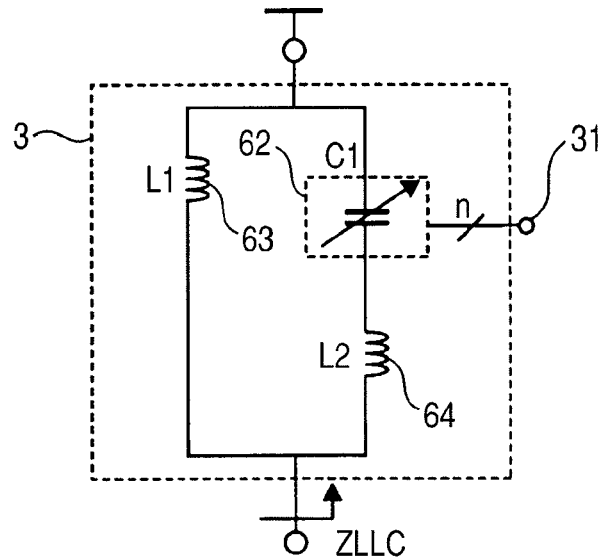
FIG. 2A is a diagram that illustrates a first typical configuration of a variable-load circuit shown in FIG. 1 by presenting an example in which one capacitor element out of three reactance function elements is variable.
Figure 2B:
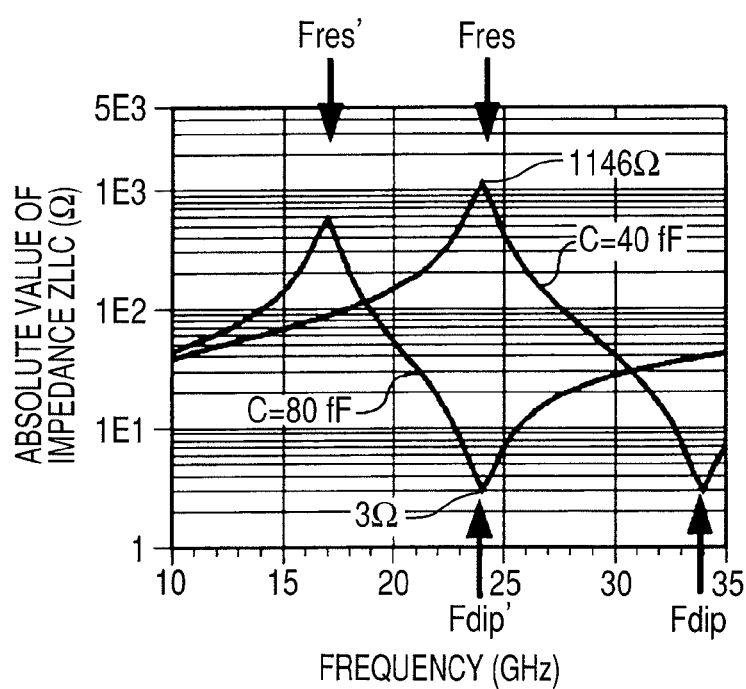
FIG. 2B is a diagram illustrating typical characteristics of the variable-load circuit shown in FIG. 2A.

The local minimum point will now be described with reference to FIGS. 2A and 2B. As shown in FIG. 2A, the variable-load circuit 3 includes an input terminal, an output terminal, and a control terminal 31. As regards an impedance appearing between the input terminal and output terminal, a control signal applied to the control terminal 31 varies a frequency in a frequency band generating a high impedance and a frequency in a frequency band generating a low impedance. The variable-gain amplifier circuit according to the present embodiment acquires the frequency dependence of impedance calculated as indicated in FIG. 2B due to the configuration shown in FIG. 2A and the parameters of L1, r1, L2, r2, and C1. The parasitic resistance of the inductor L1 is designated as r1, whereas the parasitic resistance of the inductor L2 is designated as r2. The calculations are performed on the assumption that the inductance values and quality factor are the same as for the calculations indicated in FIG. 20B.

When the characteristics are such that C1=40 fF, it is possible to have a local maximum point (1146Ω) at 24 GHz and a local minimum point at 34 GHz. When the characteristics are such that C1=80 fF, the value of C1 is increased to 80 fF to shift the frequency dependence toward a low frequency. The resulting characteristics are wide enough to cover a range from high impedance to a local minimum point of 3Ω. As regards a frequency of 24 GHz, therefore, the impedance can be changed 382 times between a local maximum point of 1146Ω and a local minimum point of 3Ω. Thus, the range of impedance variation can be enlarged without sacrificing a feature indicated in FIGS. 20A and 20B, which doubles as a bias function. Consequently, when an input signal for the variable-gain amplifier circuit is unduly small, the control signal applied to the control terminal 31 can increase the gain by exercising control to switch to a state where C1=40 fF. When, on the contrary, the input signal is unduly great, the control signal can suppress the gain by exercising control to switch to a state where C1=80 fF.

The present embodiment makes it possible to provide an amplifier circuit that implements a wide range of variable-impedance functionality by using a variable-element function in an LC circuit formed by three reactance function elements, and uses the LC circuit as a load.

Modification of the First Embodiment

Figure 3A:
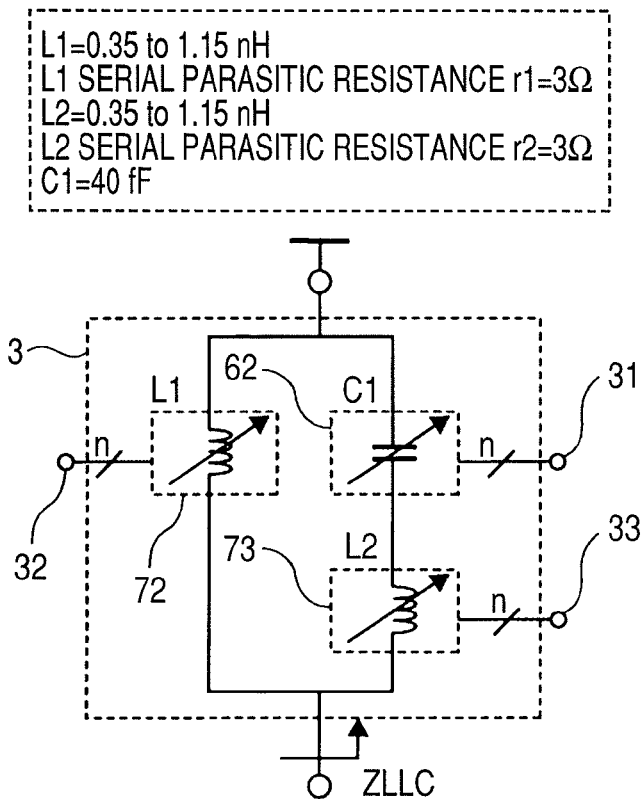
FIG. 3A is a diagram that illustrates a modification of the configuration of the variable-load circuit shown in FIG. 2A by presenting an example in which an inductor element out of three reactance function elements is variable.
Figure 3B:
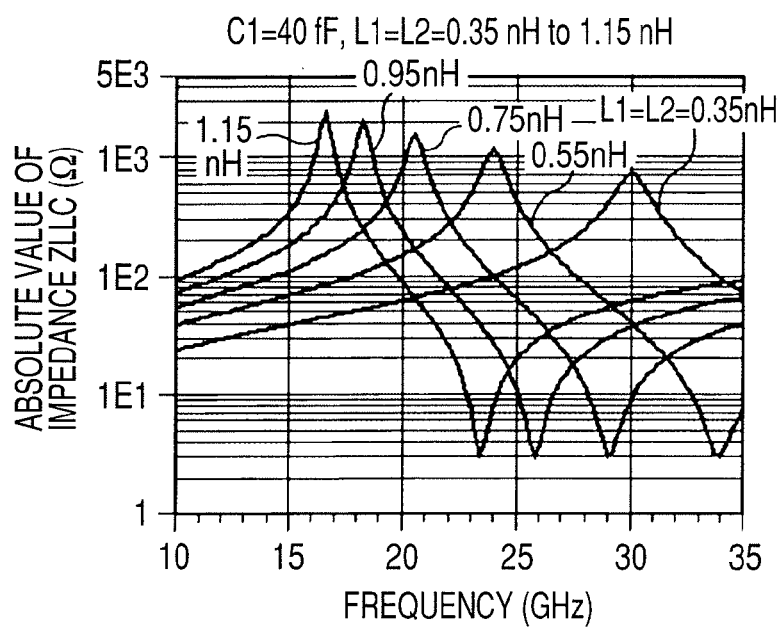
FIG. 3B is a diagram illustrating typical characteristics of the variable-load circuit shown in FIG. 3A.

FIG. 3A shows a modification of the variable-load circuit shown in FIG. 2A wherein the inductor element out of three reactance function elements is variable. FIG. 3B shows impedance changes that occur when the inductor element shown in FIG. 2A is variable. As shown in FIG. 3B, the variable-load circuit 3 can generate a local minimum point in the frequency dependence of impedance because the three reactance function elements include one variable-capacitance element (C1) 62, two variable-inductance elements (L1, L2) 72, 73 and three variable control terminals 31, 32, 33, and have a parallel connection structure between the C1-L2 series connection circuit and the variable-inductance element L1 as shown in FIG. 3A.

The variable-gain amplifier circuit according to the present modification acquires the frequency dependence of impedance calculated as indicated in FIG. 3B due to the configuration and parameters shown in FIG. 3A. When the L1 and L2 values are varied within a range of 0.35 nH to 1.15 nH while the C1 value is maintained in a 40 fF state, the frequency response of impedance greatly changes as shown in FIG. 3B. More specifically, as regards impedances appearing between an input terminal and an output terminal, there are a frequency band that generates five high impedances, and a frequency band that generates five low impedances. Control signals applied to variable control terminals 32, 33 change a frequency in the frequency band generating the high impedances and a frequency in the frequency band generating the low impedances. This provides an advantage in that even a range uncontrollable by a variable-capacitance element alone can be controlled.

According to the present modification, the impedance can be controlled over a wide range as is the case with the control of a variable-inductance element and a variable-capacitance element. Therefore, the present modification makes it possible to implement a desired impedance characteristic by compensating for element value changes occurring, for instance, in a semiconductor process.

Second Embodiment

Figure 4A:
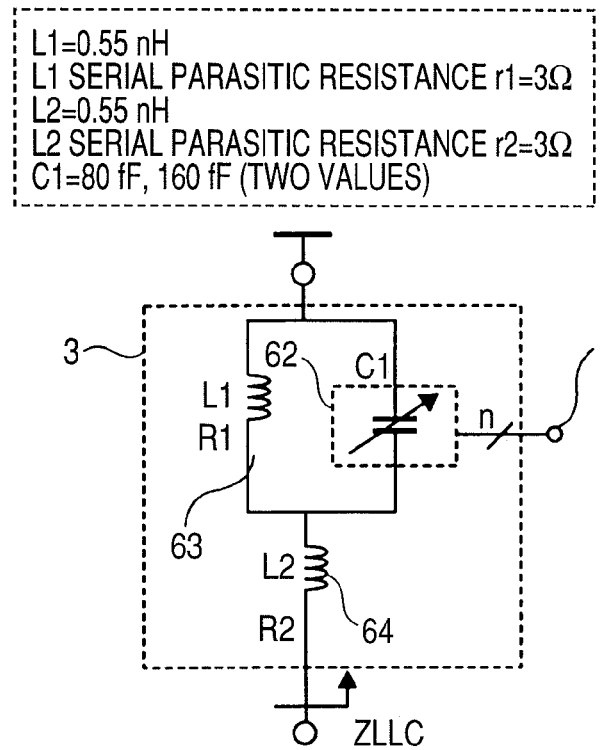
FIG. 4A is a diagram that illustrates a second typical configuration of a variable-load circuit according to an embodiment of the present invention by presenting an example in which a capacitor element is variable.

The variable-load circuit implemented by three reactance function elements is not limited to the configuration according to the first embodiment. For example, such a variable-load circuit can also be implemented by the configuration shown in FIG. 4A. As shown in FIG. 4A, this alternative configuration is such that the two fixed-inductance elements (L1, L2) 63, 64 are serially arranged with the one variable-capacitance element (C1) 62 connected in parallel with the fixed-inductance element L1. More specifically, the three reactance function elements include a first variable capacitor, a first inductor, and a second inductor. One terminal of the first inductor is used as an input terminal of the variable-load circuit. The other terminal of the first inductor is connected to one terminal of the second inductor. The other terminal of the second inductor is used as an output terminal of the variable-load circuit. One terminal of the first variable capacitor is connected to connection terminals of the first and second inductors. The other terminal of the first variable capacitor is used as an output terminal of the variable-load circuit. The capacitance control terminal 31 of the first variable capacitor is used as a control terminal of the variable-load circuit.

Figure 4B:
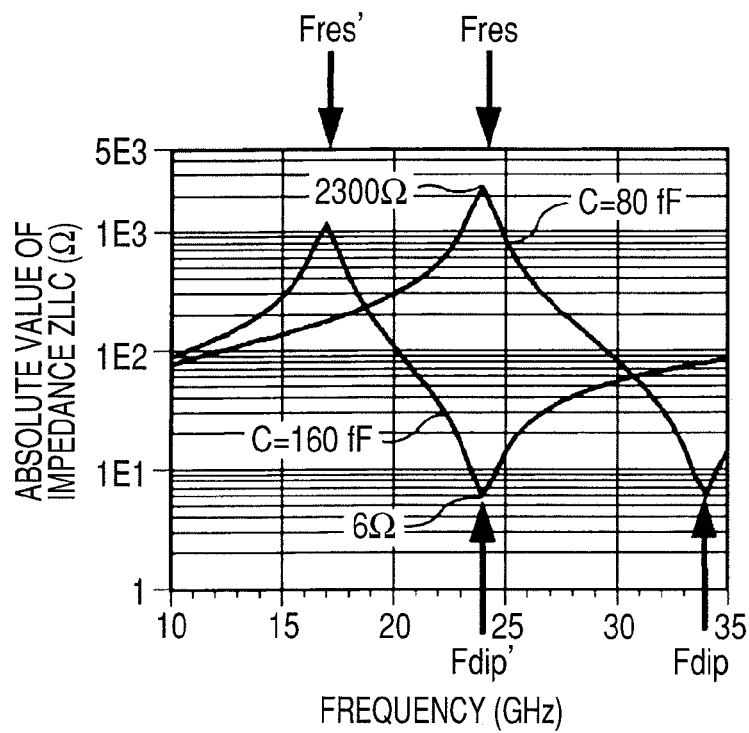
FIG. 4B is a diagram illustrating typical characteristics of the variable-load circuit shown in FIG. 4A.

When the configuration and parameters shown in FIG. 4A are used, the resultant structure makes it possible to obtain a local maximum point (2300Ω) and a local minimum point (6Ω) at a frequency of 24 GHz in a situation where control is exercised to provide two C1 values, namely, 80 fF and 160 fF, as shown in FIG. 4B. The absolute value of impedance is approximately two times the corresponding value in the first embodiment. The impedance change ratio can be as high as 383 times at a frequency of 24 GHz.

According to the second embodiment, the impedance can be controlled over a wide range as is the case with the control of a variable-capacitance element. Therefore, the second embodiment makes it possible to implement a desired impedance characteristic by compensating for element value changes occurring, for instance, in a semiconductor process.

Modification of Second Embodiment

Figure 5A:
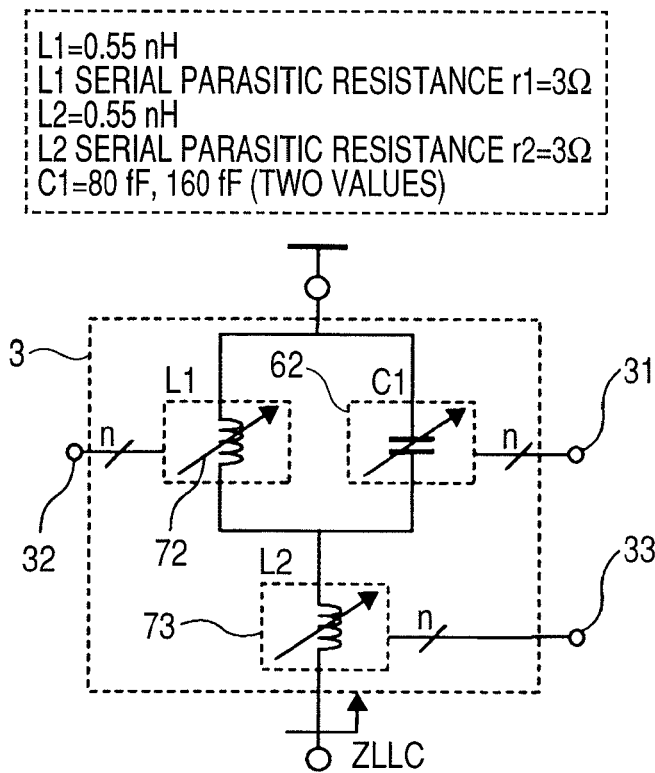
FIG. 5A is a diagram that illustrates a modification of the variable-load circuit shown in FIG. 4A by presenting an example in which a capacitor element and an inductor element are variable.
Figure 5B:
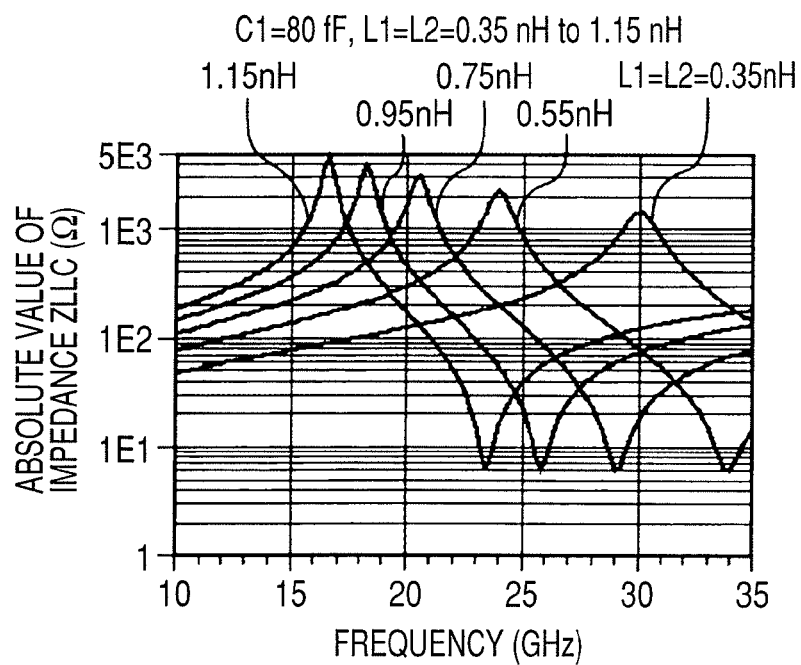
FIG. 5B is a diagram illustrating impedance changes of the variable-load circuit shown in FIG. 5A.

FIGS. 5A and 5B relate to a structure that is obtained when the inductor elements (L1, L2) in the example shown in FIGS. 4A and 4B are made variable. More specifically, as shown in FIG. 5A, the two variable-inductance elements (L1, L2) 72, 73 are serially arranged with the one variable-capacitance element (C1) 62 connected in parallel with the variable-inductance element L1. In other words, the variable-load circuit 3 includes three elements, namely, a first variable capacitor 62, a first variable inductor 72, and a second variable inductor 73. One terminal of the first variable inductor is used as an input terminal of the variable-load circuit. The other terminal of the first variable inductor is connected to one terminal of the second inductor. The other terminal of the second variable inductor is used as an output terminal of the variable-load circuit. One terminal of the first variable capacitor is connected to connection terminals of the first and second inductors. The other terminal of the first variable capacitor is used as an output terminal of the variable-load circuit. The capacitance control terminal 31 of the first variable capacitor, the inductor control terminal 32 of the first variable inductor, and the inductor control terminal 33 of the second variable inductor are used as three control terminals of the variable-load circuit.

Impedance changes occurring in the above example are indicated in FIG. 5B. When the L1 and L2 values are varied within a range of 0.35 nH to 1.15 nH while the C1 value is maintained in an 80 fF state in a situation where the configuration and parameters shown in FIG. 5A are used, the frequency response of impedance changes greatly.

According to the present modification, the impedance can be controlled over a wide range as is the case with the control of a variable-capacitance element. Therefore, the present modification makes it possible to implement a desired impedance characteristic by compensating for element value changes occurring, for instance, in a semiconductor process.

Third Embodiment

Figure 6A:
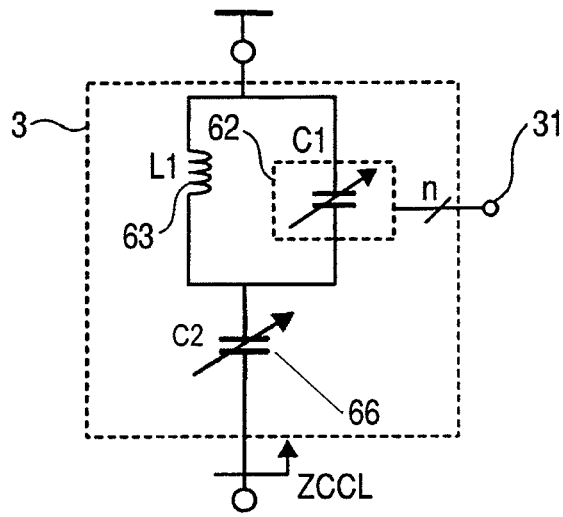
FIG. 6A is a diagram that illustrates a third typical configuration of a variable-load circuit according to an embodiment of the present invention by presenting an example in which a capacitor element is variable.
Figure 6B:
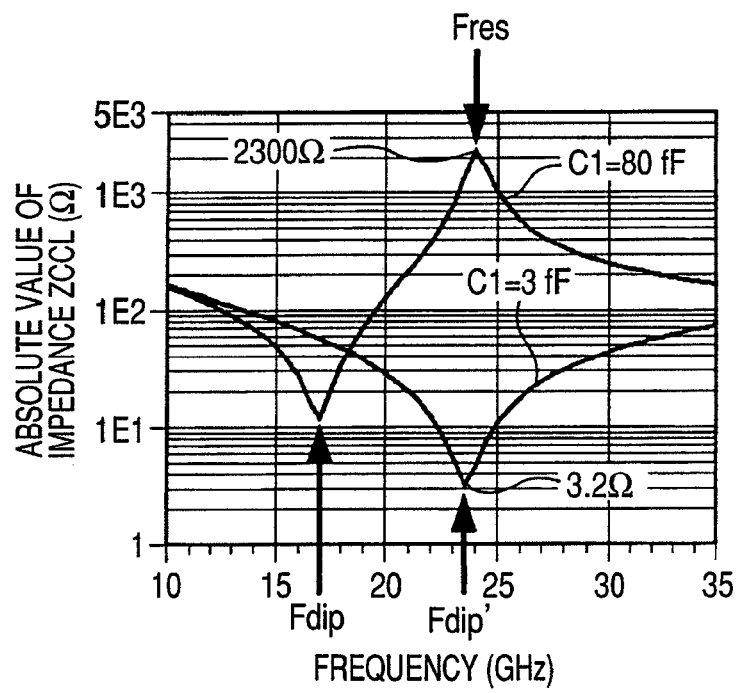
FIG. 6B is a diagram illustrating typical characteristics of the variable-load circuit shown in FIG. 5A.

The present invention can also be implemented when the variable-load circuit having three reactance function elements is configured as shown in FIG. 6A. An example shown in FIGS. 6A and 6B represents a case where two out of the three reactance function elements are variable-capacitance elements. More specifically, the two variable-capacitance elements (C1, C2) 62, 66 are serially arranged with the one variable-capacitance element (C1) 62 connected in parallel with a fixed-inductance element (L1) 63 as shown in FIG. 6A.

FIG. 6B shows impedance changes occurring in the example in which the configuration and parameters shown in FIG. 6A are used. The above-described structure makes it possible to obtain a local maximum point (2300Ω) and a local minimum point (3.2Ω) at a frequency of 24 GHz when control is exercised to provide 3 fF and 80 fF as the two values of the variable capacitor C1. In this manner, a change ratio higher than 700 times can be obtained by changing the value of the variable capacitor C1. In this instance, the gain can be changed by incorporating the variable capacitor for exhibiting a high change ratio. Further, it can be used in a situation where a DC current is not biased through the variable-load circuit. In addition, the frequency dependence is such that a local minimum value and a local maximum value are generated in a low-frequency region and a high-frequency region, respectively. This makes it possible to provide frequency dependence contrary to the frequency dependence of impedance that is exhibited by the first and second embodiments. From the viewpoint of stability such as the prevention of parasitic oscillation, it goes without saying that an appropriate one of the aforementioned variable-load circuits needs to be selected depending on the type of the employed amplifier circuit.

Modification of the Third Embodiment

Figures 7A, 7B:
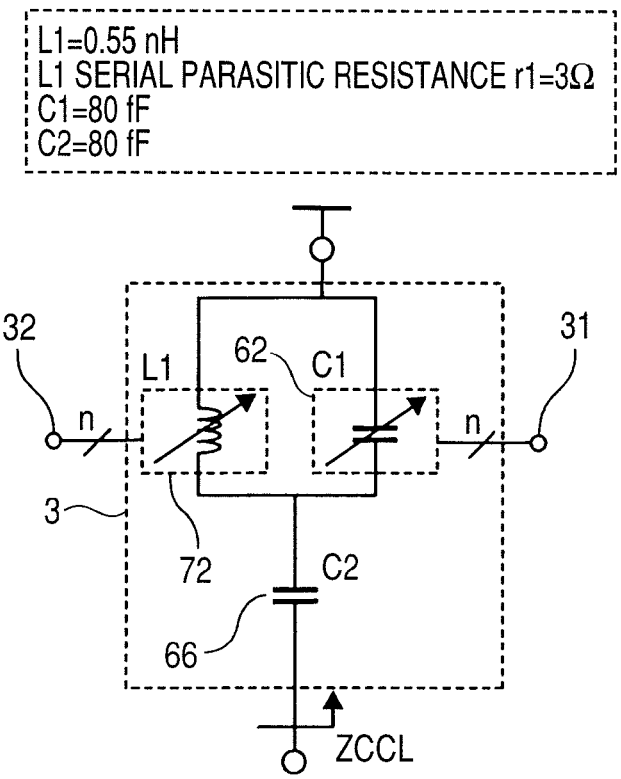
FIG. 7A is a diagram that illustrates a modification of the configuration of the variable-load circuit shown in FIG. 6A by presenting an example in which an inductor element is variable.
FIG. 7B is a diagram illustrating impedance changes of the variable-load circuit shown in FIG. 7A.

An example shown in FIGS. 7A and 7B shows an embodiment in which the inductor element (L1) according to the embodiment shown in FIGS. 6A and 6B is made variable. More specifically, as shown in FIG. 7A, this structure is such that one variable-capacitance element (C1) 62 is connected in parallel with a variable-inductance element (L1) 72.

FIG. 7B shows impedance changes occurring in the example in which the configuration and parameters shown in FIG. 7A are used. When the L1 value is varied within a range of 0.28 nH to 0.55 nH while the C1 value is maintained in an 80 fF state, the frequency response of impedance changes greatly.

According to the present modification, the impedance can be controlled over a wide range as is the case with the control of a variable-capacitance element. Therefore, the present modification makes it possible to implement a desired impedance characteristic by compensating for element value changes occurring, for instance, in a semiconductor process.

Figure 8:
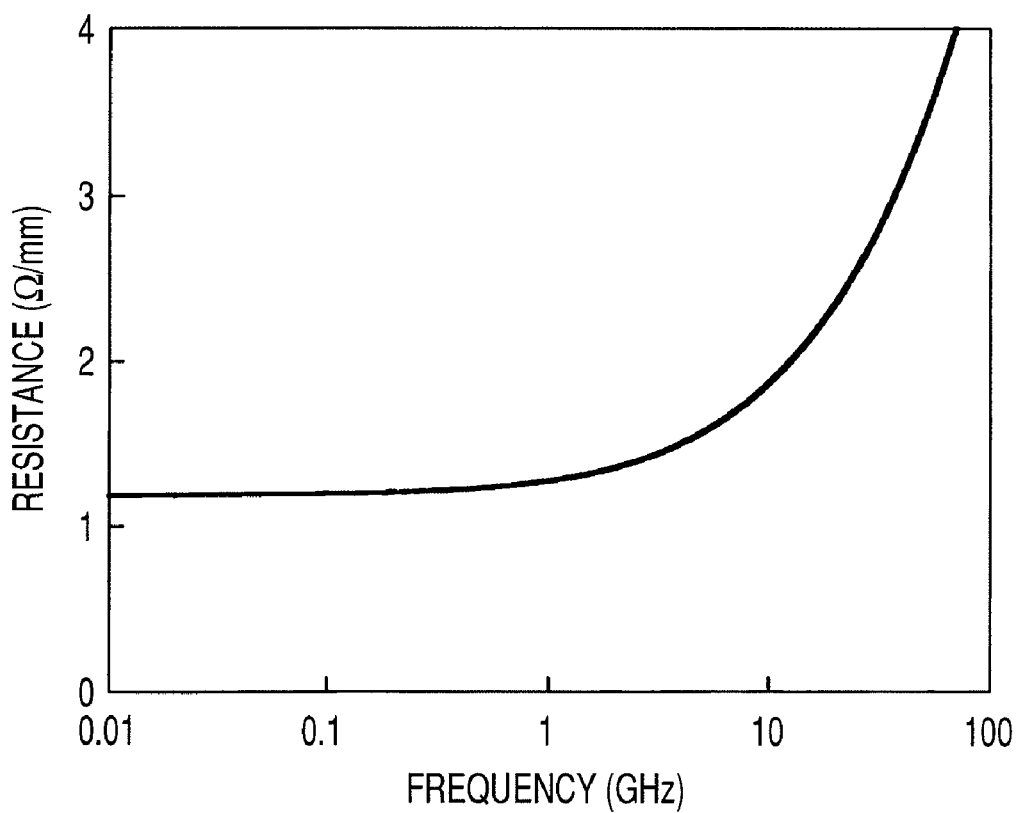
FIG. 8 shows an example in which the equivalent series resistance of a metal conductor is calculated in consideration of a skin effect.

FIG. 8 shows the frequency dependence of a skin effect produced by the embodiments of the present invention that are described with reference to FIGS. 1 to 7B. The embodiments described above greatly depend on the performance of a passive element that is implemented by an integrated circuit. However, an inductor element implemented by metal wiring is affected by the skin effect. As shown in FIG. 8, the equivalent resistance of a metal conductor increases at a frequency higher than 10 GHz. When it comes to the characteristics of an inductor, it means that the quality factor decreases as the loss increases at a high frequency. Therefore, the degree of resonance of an LC resonance circuit is low at a high frequency. In LC resonance of two elements (in the example shown in FIGS. 20A and 20B), it is difficult to implement enhanced variable-impedance functionality described in conjunction with the embodiments of the present invention.

Fourth Embodiment

To accurately obtain a desired capacitance value, a variable capacitor forming a set of the reactance function elements according to the foregoing embodiments of the present invention shown in FIGS. 1 to 7B should preferably be implemented by plural variable-capacitance elements that are integrated to operate in a coordinated manner.

FIG. 9 shows an embodiment of variable capacitors that can be integrated. In the example shown in FIG. 9, one or more serial connection circuits of switches whose opening and closing can be controlled by a capacitor and a control terminal are connected in a parallel manner to change the overall capacitance value of variable capacitors. More specifically, a variable-capacitance element (C1) 62 is a functional circuit that includes a control terminal VCSW composed of plural bits and two input/output ports 60, 61. Segmentalized capacitors C01-C0$n$ are arranged in parallel with each other. Switches SW1-SWn are serially inserted into individual capacitors. These elements are controlled by control terminals VCSW1-VCSWn to provide capacitance variability.

FIG. 10 shows a first embodiment of a variable inductor that can be integrated as reactance function elements 72, 73. It is a functional circuit that includes a control terminal VLSW composed of plural bits and two input/output ports 70, 71. One or more serial connection circuits of switches whose opening and closing can be controlled by an inductor and an control terminal are connected in a parallel manner to the variable inductors to change the overall inductance value of variable inductors. More specifically, segmentalized inductors L01-L0$n$ are arranged in parallel with each other. Switches SW1-SWn are serially inserted into individual inductors. These elements are controlled by control terminals VLSW1-VLSWn to provide inductance variability.

FIG. 11 shows a second embodiment of a variable inductor that can be integrated as reactance function elements 72, 73. The variable inductor includes a primary circuit, which is formed by a first inductor, and a secondary circuit, which is formed by serially connecting a second inductor to a first variable capacitor. The mutual inductance between the first and second inductors is controlled by the first variable capacitor to change a primary inductance value. In other words, it is a functional circuit that includes a control terminal composed of plural bits and two input/output ports. The employed configuration includes the primary circuit, which is formed by the first inductor L01, and the secondary circuit, which is formed by serially connecting the second inductor L02 to the first variable capacitor 62. This configuration enables the variable capacitor to control the effective mutual inductance K between the first and second inductors although the two inductors are employed. This makes it possible to vary the inductance value that is continuously visible on the primary side. As a result, the element area can be smaller than that of the circuit shown in FIG. 10. In addition, it is possible to provide continuous-value control of effective inductance.

Fifth Embodiment

Figure 12:
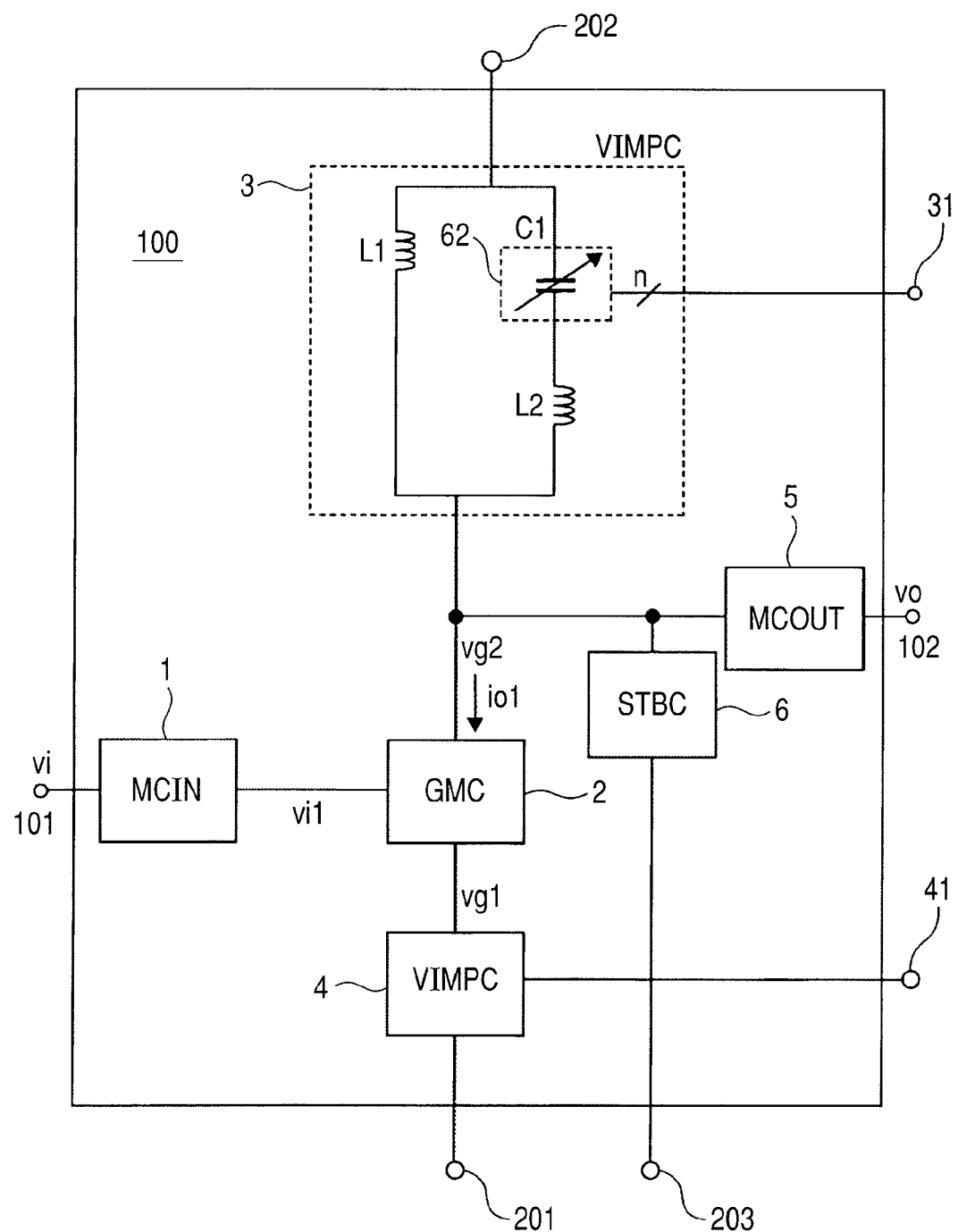
FIG. 12 is a diagram illustrating an embodiment of an amplifier circuit of the present invention in which a conductor circuit is provided with plural variable-load circuits.

FIG. 12 shows a fifth embodiment of an amplifier circuit of the present invention in which the conductor circuit 2 (GMC) is provided with plural variable-load circuits. The amplifier circuit 100 includes the input matching circuit 1 (MCIN), the conductor circuit 2 (GMC), the first variable-load circuit 3 (VIMPC), a second variable-load circuit 4 (VIMPC), the output matching circuit 5 (MCOUT), and the stabilization circuit 6 (STBC).

The second variable-load circuit 4 (VIMPC) differs from the first variable-load circuit 3 (VIMPC) in that the former is positioned between a reference voltage terminal of the conductor circuit 2 and a terminal 201 having a definite potential and capable of dividing an AC voltage applied to the conductor circuit as the voltage signal vi1 and supplying the divided voltages to the conductor circuit 2 and the second variable-load circuit 4. The impedance value and frequency response of the second variable-load circuit 4 can be controlled by a control voltage applied to a variable-control terminal 41.

Here, the conductor circuit 2 is sandwiched between the variable-load circuits 3, 4, which are on the load side and reference potential side, respectively. Therefore, when the second variable-load circuit 4 is set to low impedance at a frequency of interest (e.g., at 24 GHz), the variable-gain function can be implemented by exercising control to set the first variable-load circuit 3 to two different impedances (high and low impedances). A significantly low gain can be obtained when the variable-load circuit 4 is set to high impedance with the variable-load circuit 3 set to low impedance.

Consequently, the fifth embodiment makes it possible to provide a wider gain variation range than the first embodiment, which is shown in FIG. 1.

Sixth Embodiment

Figure 13:
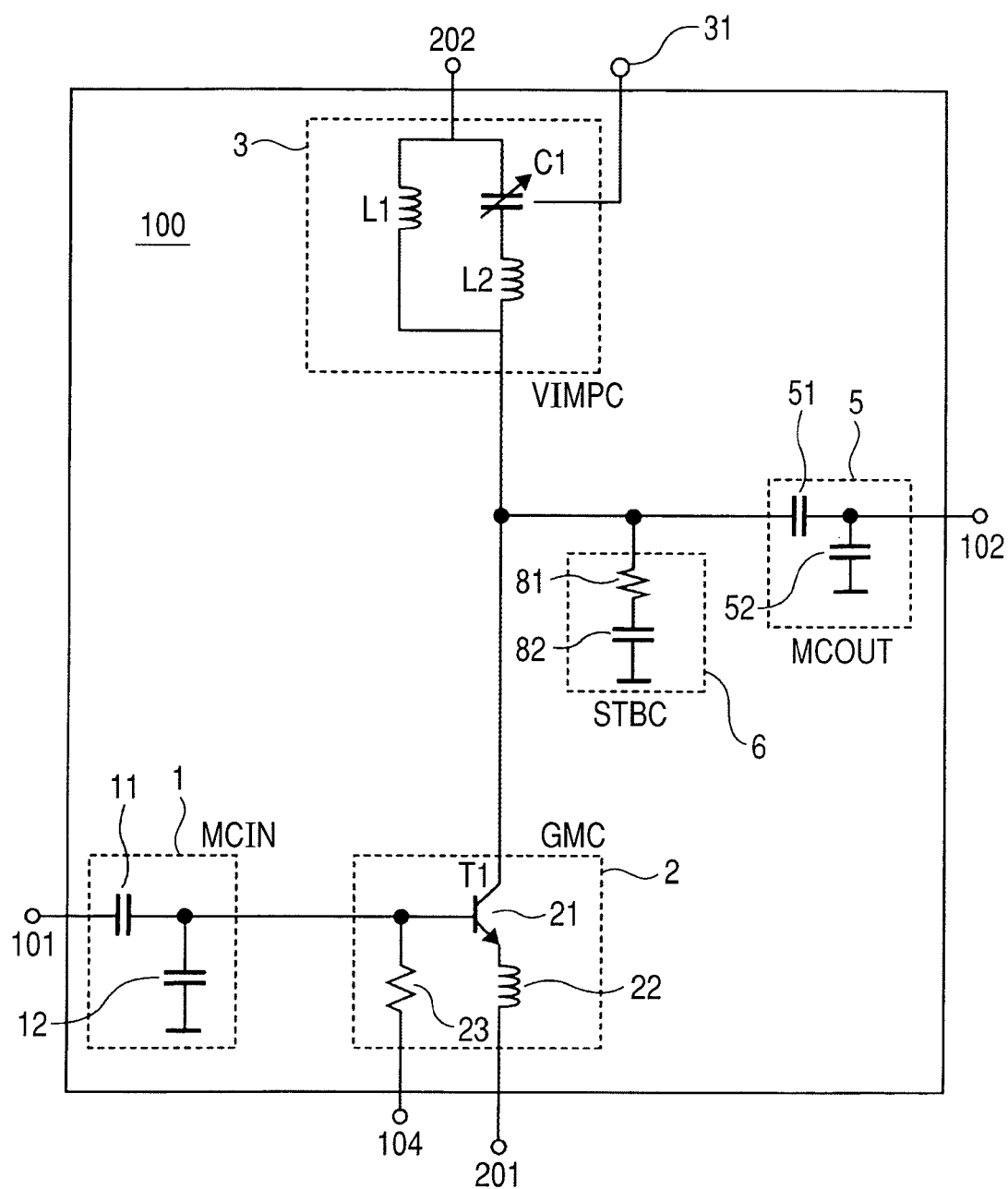
FIG. 13 is a diagram illustrating the configuration of a variable-gain amplifier circuit formed on a semiconductor chip of a semiconductor integrated circuit according to another embodiment of the present invention.

A sixth embodiment of the present invention will now be described with reference to FIG. 13. FIG. 13 shows the detailed configuration of a variable amplifier circuit that uses a bipolar transistor as an amplifying element of the conductor circuit 2 (GMC). In the sixth embodiment, the configuration of the variable-load circuit 3 (VIMPC) is the same as that of any foregoing embodiment. Here, it is assumed, for example, that the configuration of the variable-load circuit 3 is the same as in the first embodiment. The amplifier circuit 100 includes a first capacitor 11 and a second capacitor 12, which constitute the input matching circuit 1. One terminal of the first capacitor is used as an input terminal 101 of the input matching circuit. The other terminal of the first capacitor is connected to one terminal of the second capacitor and used as an output terminal of the input matching circuit. The other terminal of the second capacitor is grounded. Further, the amplifier circuit 100 includes a first n-type bipolar transistor 21, a first resistor 23, and a first inductor 22, which constitute the conductor circuit 2. The base of the first n-type bipolar transistor is used as an input terminal of the conductor circuit. The collector of the first n-type bipolar transistor is used as an output terminal of the conductor circuit. One terminal of the first inductor is connected to the emitter of the first n-type bipolar transistor. The other terminal of the first inductor is grounded. One terminal of the first resistor is connected to the base of the first n-type bipolar transistor. The other terminal of the first resistor is used as a bias terminal of the conductor circuit. Furthermore, the amplifier circuit 100 includes a third capacitor 51 and a fourth capacitor 52, which constitute the output matching circuit 5. One terminal of the third capacitor is used as an input terminal of the output matching circuit. The other terminal of the third capacitor is connected to one terminal of the fourth capacitor and used as an output terminal 102 of the output matching circuit. The other terminal of the fourth capacitor is grounded. Moreover, the amplifier circuit 100 includes a second resistor 81 and a fifth capacitor 82, which constitute the stabilization circuit 6. One terminal of the second resistor is connected to an output terminal of the conductor circuit 2. The other terminal of the second resistor is connected to one terminal of the fifth capacitor. The other terminal of the fifth capacitor is grounded. The base potential of the bipolar transistor 21 connected to the input matching circuit 1 is controlled by a base potential control terminal 104.

The input matching circuit 1 and the output matching circuit 5 are both formed by capacitors only. However, the present invention is not limited to such a configuration. Particularly, the variable-load circuit according to the sixth embodiment may experience an impedance increase at an unwanted frequency. However, when the configuration and constants for the matching circuits are predefined to suppress input and output signals at an unwanted frequency, it is possible to avoid parasitic oscillation and other problems.

Seventh Embodiment

Figure 14:
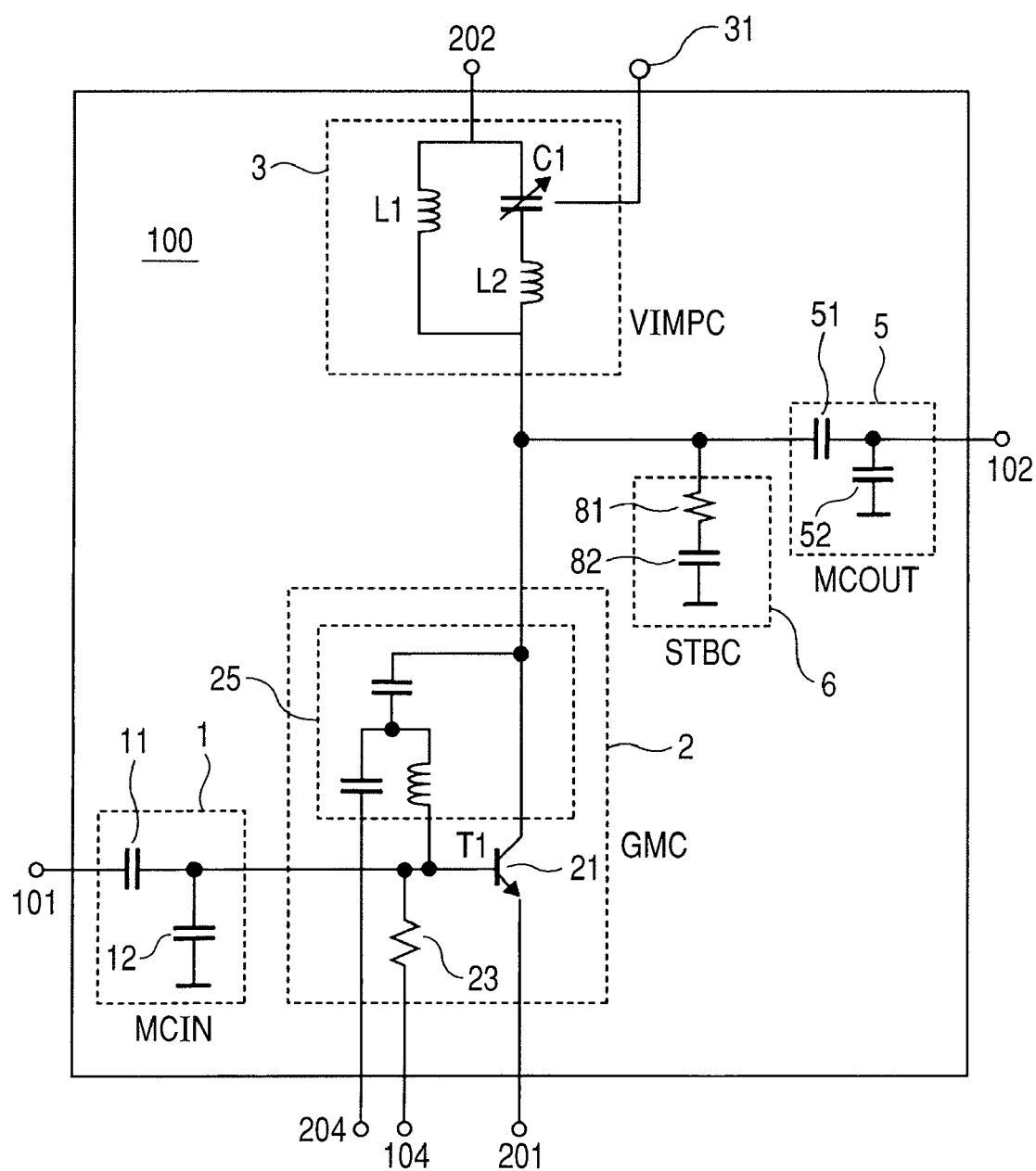
FIG. 14 is a diagram illustrating the configuration of a variable-gain amplifier circuit formed on a semiconductor chip of a semiconductor integrated circuit according to another embodiment of the present invention.

FIG. 14 shows the detailed configuration of a second variable amplifier circuit that uses a bipolar transistor as an amplifying element of the conductor circuit 2 (GMC). The circuitry shown in FIG. 14 differs from the circuitry shown in FIG. 13 in that a feedback circuit 25 is added to the conductor circuit 2 (GMC). The reference numeral 204 denotes a voltage terminal that gives a predetermined potential.

The above-described configuration makes it possible to add a notch characteristic to the frequency dependence of gain. As mentioned above, it is possible to use various GMC circuit configurations and implement a variable-gain characteristic.

Figure 15:
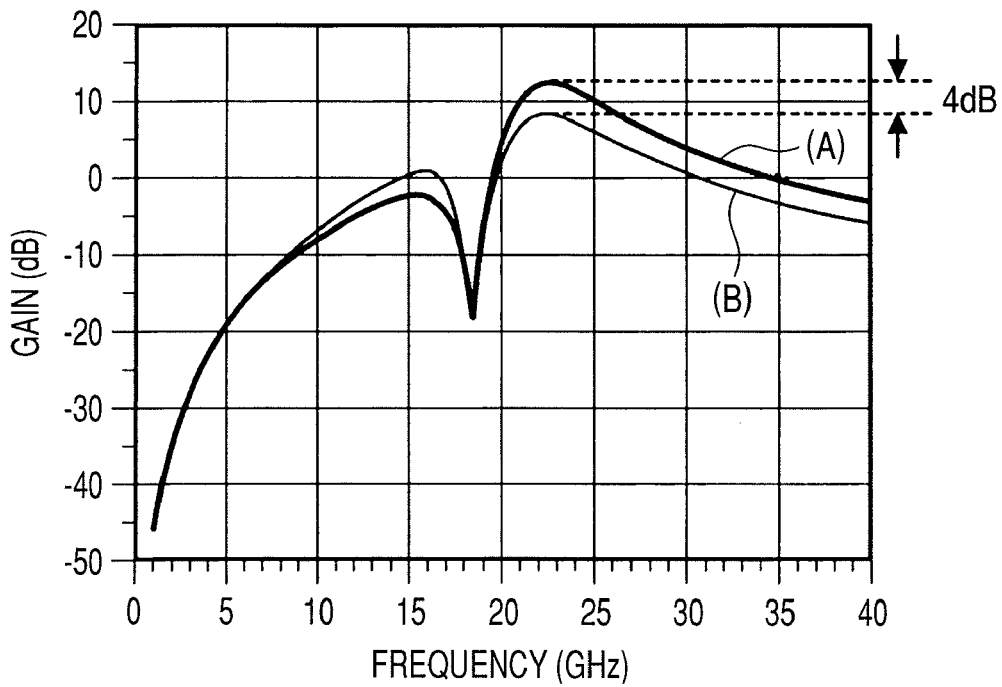
FIG. 15 shows a comparative example in which the frequency dependence of an amplifier circuit gain is calculated in a situation where the variable-load circuit of a prior art shown in FIG. 20A is used in the embodiment shown in FIG. 1.
Figure 20A:
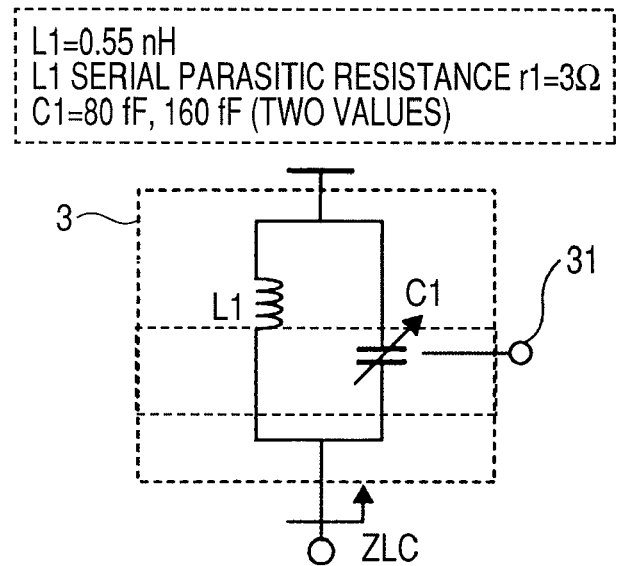
FIG. 20A is a diagrams illustrating the configuration of a conventional variable-load circuit.
Figure 20B:
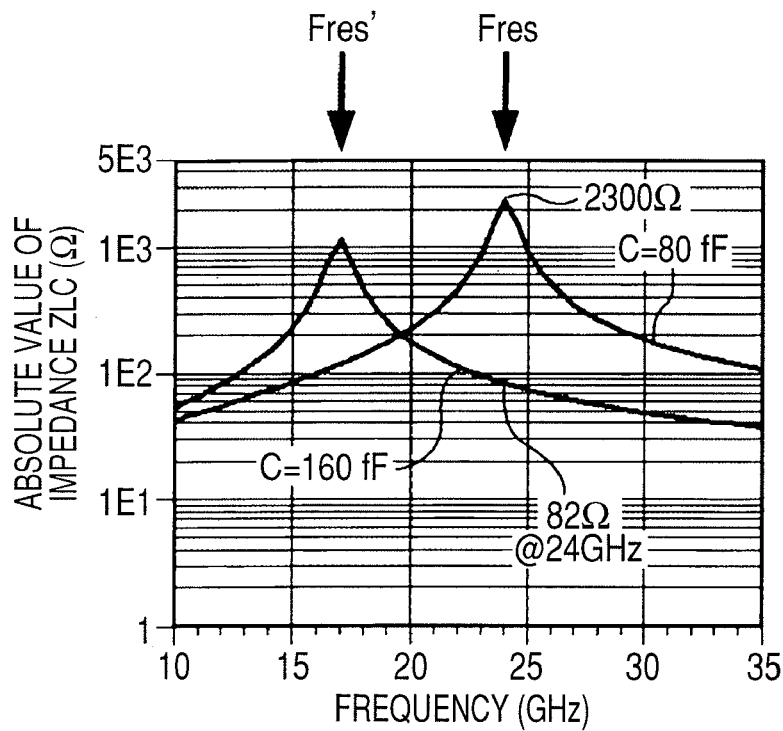
FIG. 20B is a diagram illustrating typical characteristics of the conventional variable-load circuit shown in FIG. 20A.

As a comparative example, FIG. 15 shows the characteristics of an amplifier circuit that uses the variable-load circuit shown in FIG. 20A. Characteristic curve (A) prevails when C1=80 fF, whereas characteristic curve (B) prevails when C1=160 fF. At a frequency of 22 GHz at which the gain peaks, the gain difference between (A) and (B) is approximately 4 dB.

Figure 16:
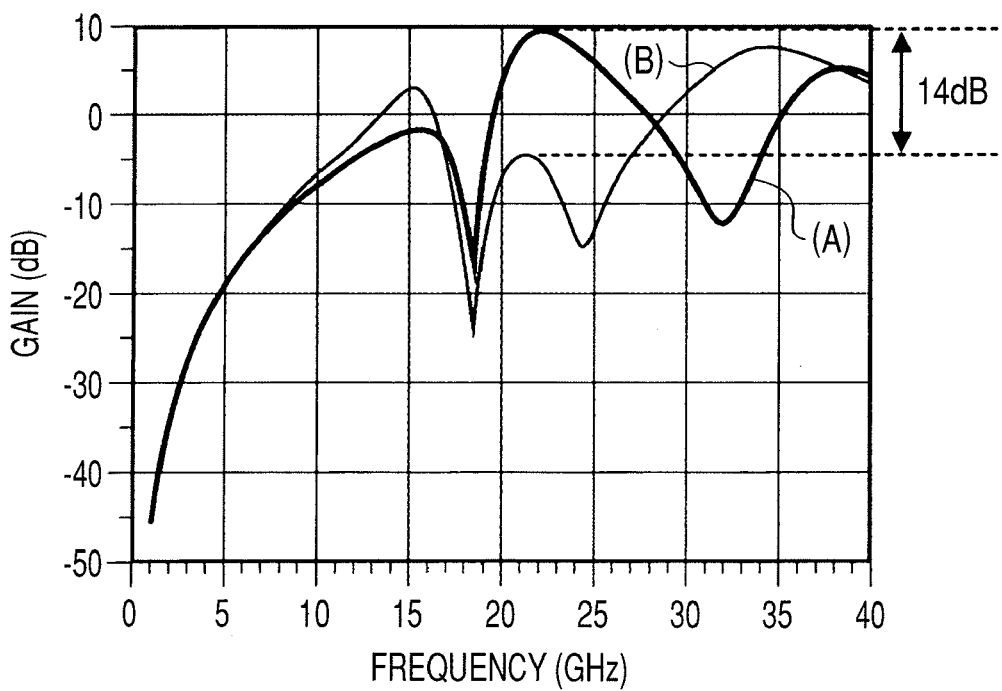
FIG. 16 shows an example in which the frequency dependence of an amplifier circuit gain is calculated in a situation where the variable-load circuit shown in FIG. 2A is used in the embodiment of the present invention shown in FIG. 1.

FIG. 16 shows the characteristics of the amplifier circuit 100 according to the seventh embodiment. Characteristic curve (A) prevails when C1=40 fF, whereas characteristic curve (B) prevails when C1=80 fF. At a frequency of 22 GHz, the gain difference between (A) and (B) is increased to approximately 14 dB. This quantitatively verifies an advantage of the present embodiment.

Eighth Embodiment

Figure 17:
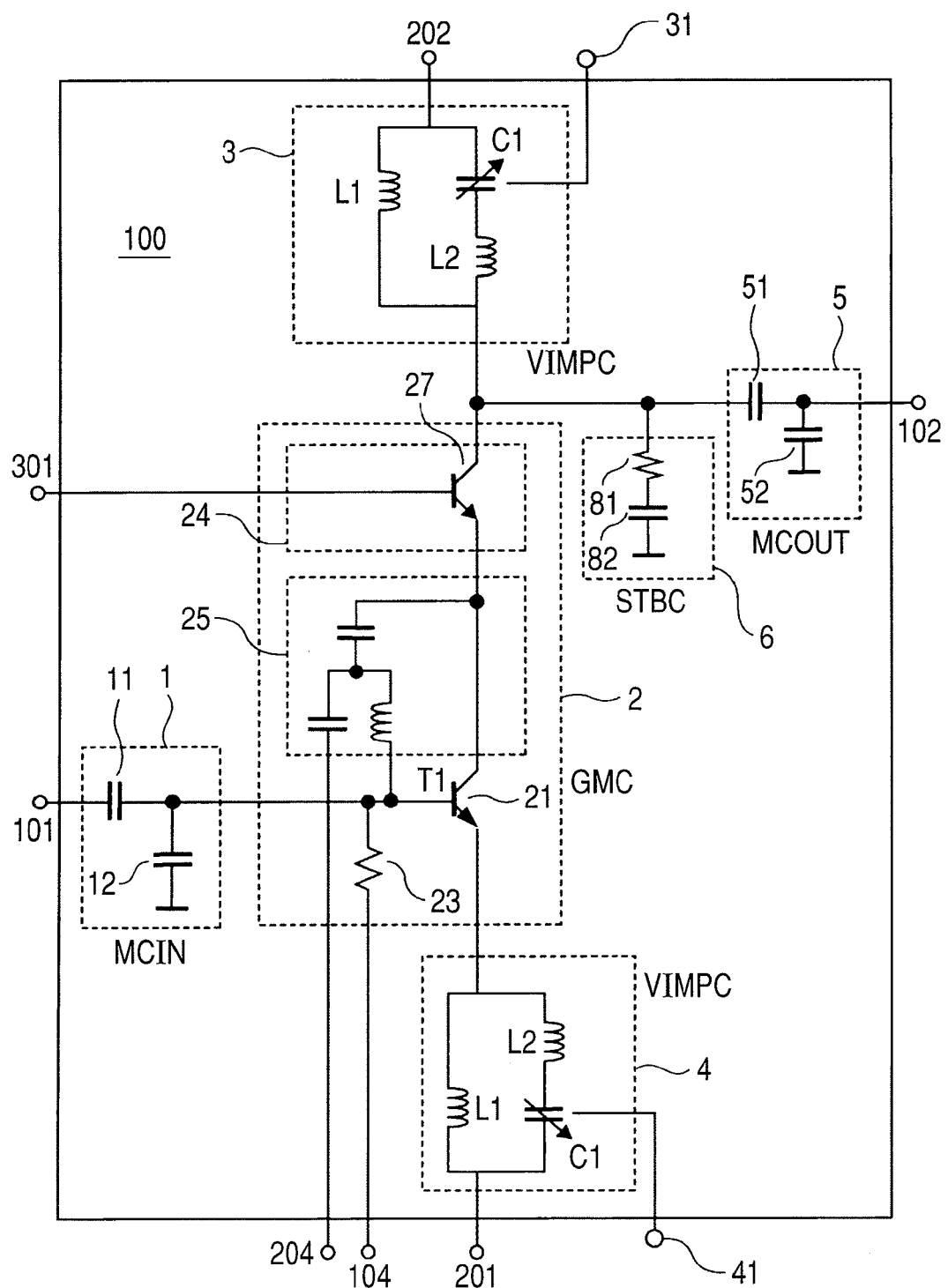
FIG. 17 is a diagram illustrating the configuration of a variable-gain amplifier circuit formed on a semiconductor chip of a semiconductor integrated circuit according to another embodiment of the present invention.

As shown in FIG. 17, an eighth embodiment is configured so that a second variable-load circuit 4 is inserted into the reference terminal side of the conductor circuit 2. Thus, the conductor circuit 2 is sandwiched between the variable-load circuits 3, 4, which can be set up on an individual basis. Therefore, the eighth embodiment is advantageous in that it provides a wider gain variation range than the embodiments shown in FIGS. 13 and 14. In addition, the conductor circuit 2 (GMC) has a cascode circuit 24, which includes a bipolar transistor 27. The reference numeral 301 denotes a voltage terminal that gives a predetermined potential. This makes it possible to provide increased isolation between the input and output of the amplifier circuit 100.

Ninth Embodiment

Figure 18:
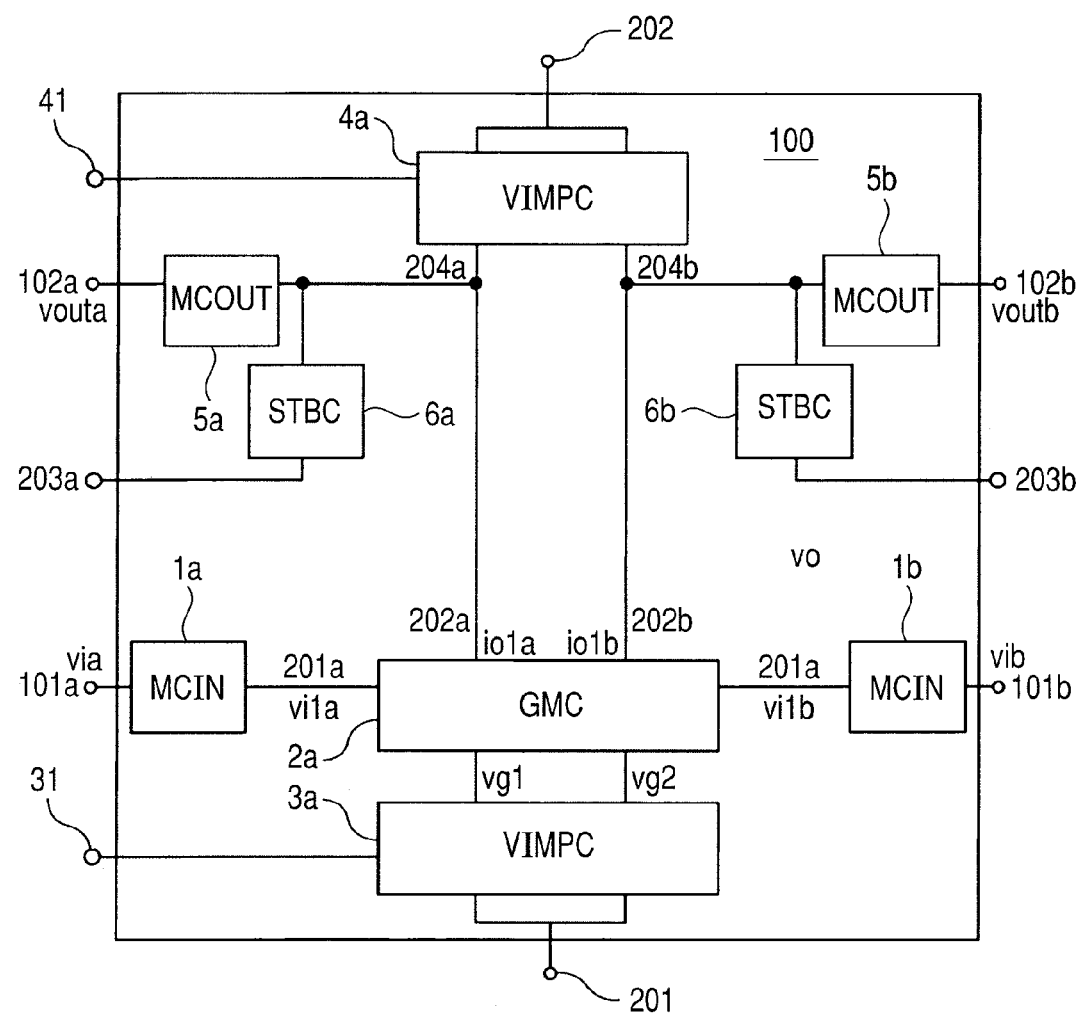
FIG. 18 is a diagram illustrating the configuration of a variable-gain amplifier circuit formed on a semiconductor chip of a semiconductor integrated circuit according to another embodiment of the present invention.

A ninth embodiment of the present invention will now be described with reference to FIG. 18. As shown in FIG. 18, the ninth embodiment is configured so that a differential amplifier circuit is used in place of the single-phase amplifier circuit 100 shown in FIG. 1. The amplifier circuit 100 according to the ninth embodiment includes input matching circuits 1a, 1b, a conductor circuit 2a, a first differential variable-load circuit 3a, a second differential variable-load circuit 4a, output matching circuits 5a, 5b, and stabilization circuits 6a, 6b. More specifically, this amplifier circuit 100 includes the first differential variable-load circuit 3a, which is capable of converting a differential input current applied to a differential input terminal connected to a differential output terminal of the conductor circuit to a differential voltage signal and controlling the conversion factor for such a conversion; the second differential variable-load circuit 4a, which is capable of converting a differential input current applied to a differential input terminal connected to a differential reference terminal of the conductor circuit to a differential voltage signal and controlling the conversion factor for such a conversion; the first and second output matching circuits 5a, 5b, which have an input terminal and an output terminal connected to differential input terminals of the differential variable-load circuits and generate a predetermined matching impedance for the subsequent input impedance at an output terminal; and the first and second stabilization circuits 6a, 6b, which are connected to differential input terminals of the first differential variable-load circuit 3a to cause resistive power loss within a specific frequency range. The input terminals of the first and second input matching circuits are used as differential input terminals 101a, 101b. The output terminals of the first and second output matching circuits are used as differential output terminals 102a, 102b. Voltage signals via, vib are applied to the input terminals 101a, 101b of the amplifier circuit. Output voltages vouta, voutb are output from the output terminals 102a, 102b of the amplifier circuit. The reference numeral 201 denotes a low constant voltage terminal. The reference numeral 202 denotes a high constant voltage terminal. The reference numerals 203a and 203b denote DC voltage application terminals.

The conductor circuit 2a (GMC) generates, at its output terminal, output current signals vouta, voutb, which are proportional to the potential difference between voltage signals vi1a, vi1b applied to its input terminal and a voltage present at its reference terminal.

The ninth embodiment uses the differential amplifier circuit 100 to enhance the effect of common mode noise component elimination.

Tenth Embodiment

The amplifier according to the foregoing embodiments of the present invention is suitable as an amplifier for a wireless communication circuit forming a wireless communication system. FIG. 19 shows a typical configuration of a wireless communication RFIC to which the amplifier circuit according to any of the first to ninth embodiments of the present invention is applied. A reception path and a transmission path, which are used for a wireless communication circuit forming a wireless communication system, are formed on an RF chip 501. The reception path includes a low-noise amplifier circuit 301, a mixer 302, a filter 303, an IF amplifier 304, a demodulator 305, and a local oscillator 306. The transmission path includes a modulator 401, an IF amplifier 402, a filter 403, a mixer 404, a driver amplifier (AMPIR) 405, a local oscillator 406, and a power amplifier 407, which is external to the RF chip 501. A variable-gain function is required for the low-noise amplifier circuit 301 in the reception path and the driver amplifier (AMPIR) 405 in the transmission path. It is assumed that gain control is exercised as shown in the figure by generating a gain control signal, which includes plural bits, in accordance with the signal amplitude of a baseband signal processing circuit 502 and controlling the variable-gain amplifier circuit according to the foregoing embodiments of the present invention. More specifically, in accordance with the signal amplitude of a baseband signal processing circuit 502, if the value of a received signal is greater than a predetermined value, the gain of the low-noise amplifier circuit 301 is decreased. If, on the other hand, the value of the received signal is smaller than the predetermined value, the gain of the low-noise amplifier circuit 301 is increased. Further, if the value of a transmitted signal is greater than a predetermined value, the gain of the driver amplifier (AMPIR) 405 is decreased. If, on the other hand, the value of the transmitted signal is smaller than the predetermined value, the gain of the driver amplifier (AMPIR) 405 is increased. The above-described gain control is implemented by controlling a relevant impedance value and frequency dependence with a control voltage that is applied from a variable-control terminal to the capacitance of each reactance function element.

While the present invention has been described in terms of preferred embodiments, the reader should understand that the invention is not limited to those preferred embodiments and can be variously modified without departing from the spirit and scope of the invention.

For example, a bipolar transistor, a heterojunction bipolar transistor, or a field-effect transistor is used as the amplifying element in the foregoing embodiments of the present invention. However, it is obvious that the same effect is obtained when, for instance, a MOS field-effect transistor, a high-electron-mobility transistor, or a metal-semiconductor junction field-effect transistor is used as the amplifying element.

It should be understood by those skilled in the art that various modifications, combinations, sub-combinations, and alterations may occur depending on design requirements and other factors insofar as they are within the scope of the appended claims or the equivalents thereof.

What is claimed is:

1. A variable-gain amplifier circuit comprising:
an input matching circuit that generates a predetermined matching impedance for a preceding output impedance;
a conductor circuit that outputs a current proportional to conductance with respect to an input voltage applied through the input matching circuit and a voltage between a reference voltage terminal and the conductor circuit;
at least one variable-load circuit having a function for converting an input current applied to the conductor circuit to a voltage signal and capable of controlling a conversion factor for the current-to-voltage conversion;
an output matching circuit that is connected to the variable-load circuit to generate a predetermined matching impedance for a succeeding input impedance; and
a stabilization circuit that is connected to the variable-load circuit to cause resistive power loss within a specific frequency range;
wherein the variable-load circuit includes three reactance function elements, at least one of the three reactance function elements being capable of changing a reactance value thereof;
wherein an input terminal of the input matching circuit is used as an input terminal of the variable-gain amplifier circuit, and an output terminal of the output matching circuit is used as an output terminal of the variable-gain amplifier circuit;
wherein the variable-load circuit is configured so that at least two of the three reactance function elements are capable of changing their reactance values; and
wherein corresponding control terminals of the at least two reactance function elements exercise control to change a variable inductance value or a variable capacitance value thereof in a coordinated manner to obtain a predetermined load impedance.

2. The variable-gain amplifier circuit according to claim 1, wherein, regarding the impedance appearing between the input terminal and the output terminal of the variable-load circuit, the variable-load circuit can be controlled such that the impedance can have one or more high values corresponding to a first frequency band and such that the impedance can have one or more low values corresponding to a second frequency band.

3. The variable-gain amplifier circuit according to claim 1, wherein the three reactance function elements include a first inductor, a second inductor, and a first variable capacitor, at least one of the first inductor and the second inductor being a variable inductor;
wherein a first terminal of the first inductor is used as an input terminal of the variable-load circuit, and a second terminal of the first inductor is connected to a first terminal of the second inductor;
wherein a second terminal of the second inductor is used as an output terminal of the variable-load circuit;
wherein a first terminal of the first variable capacitor is connected to the first and second inductors;
wherein a second terminal of the first variable capacitor is connected to the first terminal of the first inductor; and
wherein a capacitance control terminal of the first variable capacitor is used as a control terminal of the variable-load circuit.

4. The variable-gain amplifier circuit according to claim 1, wherein the three reactance function elements include a first variable inductor, a second variable inductor, and a first variable capacitor;
wherein a first terminal of the first variable inductor is used as an input terminal of the variable-load circuit, and a second terminal of the first variable inductor is connected to a first terminal of the second variable inductor;
wherein a second terminal of the second variable inductor is used as an output terminal of the variable-load circuit;
wherein a first terminal of the first variable capacitor is connected to the first and second variable inductors;
wherein a second terminal of the first variable capacitor is connected to the first terminal of the first variable inductor; and
wherein an inductor control terminal of the first variable inductor, an inductor control terminal of the second variable inductor, and a capacitance control terminal of the first variable capacitor are used as control terminals of the variable-load circuit.

5. The variable-gain amplifier circuit according to claim 1, wherein the three reactance function elements include a first capacitor, a first variable capacitor, and a first inductor, one of the first capacitor and the first inductor being variable;
wherein a first terminal of the first capacitor is used as an input terminal of the variable-load circuit, and a second terminal of the first capacitor is connected to a first terminal of the first variable capacitor;
wherein a second terminal of the first variable capacitor is used as an output terminal of the variable-load circuit;
wherein a first terminal of the first inductor is connected to the first capacitor and the first variable capacitor;
wherein a second terminal of the first inductor is connected to the first terminal of the first capacitor; and
wherein a capacitance control terminal of the first variable capacitor is used as a control terminal of the variable-load circuit.

6. The variable-gain amplifier circuit according to claim 1, wherein the three reactance function elements include a first variable capacitor, a second variable capacitor, and a first inductor;
wherein a first terminal of the first variable capacitor is used as an input terminal of the variable-load circuit, and a second terminal of the first variable capacitor is connected to a first terminal of the second variable capacitor;
wherein a second terminal of the second variable capacitor is used as an output terminal of the variable-load circuit;
wherein a first terminal of the first inductor is connected to the first and second variable capacitors;
wherein a second terminal of the first inductor is connected to the first terminal of the first variable capacitor; and
wherein a capacitance control terminal of the first variable capacitor, a capacitance control terminal of the second variable capacitor, and an inductor control terminal of the first variable inductor are used as control terminals of the variable-load circuit.

7. The variable-gain amplifier circuit according to claim 1, wherein the variable-load circuit includes a correction circuit that references an output voltage amplitude of the variable-gain amplifier circuit at a specific frequency, wherein a predetermined load impedance is obtained by adjusting a variable inductance value or a variable capacitance value based on a value of a voltage present at an output terminal of the correction circuit.

8. A variable-gain amplifier circuit comprising:
an input matching circuit that generates a predetermined matching impedance for a preceding output impedance;
a conductor circuit that outputs a current proportional to conductance with respect to an input voltage applied through the input matching circuit and a voltage between a reference voltage terminal and the conductor circuit;
at least one variable-load circuit having a function for converting an input current applied to the conductor circuit to a voltage signal and capable of controlling a conversion factor for the current-to-voltage conversion;
an output matching circuit that is connected to the variable-load circuit to generate a predetermined matching impedance for a succeeding input impedance; and
a stabilization circuit that is connected to the variable-load circuit to cause resistive power loss within a specific frequency range;
wherein the variable-load circuit includes three reactance function elements, at least one of the three reactance function elements being capable of changing a reactance value thereof;
wherein an input terminal of the input matching circuit is used as an input terminal of the variable-gain amplifier circuit, and an output terminal of the output matching circuit is used as an output terminal of the variable-gain amplifier circuit;
wherein the conductor circuit includes:
a conductor core circuit that outputs an output current proportional to an input voltage,
a feedback circuit having an input terminal directly connected to an output terminal of the conductor core circuit, and
a cascode circuit connected to the output terminal of the conductor core circuit,
wherein an input terminal of the conductor core circuit is used as an input terminal of the conductor circuit, and an output terminal of the cascode circuit is used as an output terminal of the conductor circuit.

9. A variable-gain amplifier circuit comprising:
an input matching circuit that generates a predetermined matching impedance for a preceding output impedance;
a conductor circuit that outputs a current proportional to conductance with respect to an input voltage applied through the input matching circuit and a voltage between a reference voltage terminal and the conductor circuit;
at least one variable-load circuit having a function for converting an input current applied to the conductor circuit to a voltage signal and capable of controlling a conversion factor for the current-to-voltage conversion;
an output matching circuit that is connected to the variable-load circuit to generate a predetermined matching impedance for a succeeding input impedance; and
a stabilization circuit that is connected to the variable-load circuit to cause resistive power loss within a specific frequency range;
wherein the variable-load circuit includes three reactance function elements, at least one of the three reactance function elements being capable of changing a reactance value thereof;
wherein an input terminal of the input matching circuit is used as an input terminal of the variable-gain amplifier circuit, and an output terminal of the output matching circuit is used as an output terminal of the variable-gain amplifier circuit;
wherein a variable inductor serves as one of the reactance function elements;
wherein the variable inductor comprises one or more serial connection circuits comprised of an inductor and a switch;
wherein opening and closing of the one or more switches is controlled by corresponding one or more signals from a control terminal; and
wherein the variable inductor changes an overall inductance value thereof based on respective states of the one or more switches.

10. The variable-gain amplifier circuit according to claim 1,
wherein a variable inductor serves as one of the reactance function elements;
wherein the variable inductor includes a primary circuit, which is formed by a first inductor, and a secondary circuit, which is formed by connecting a second inductor in series with a first variable capacitor; and
wherein the first variable capacitor controls a mutual inductance between the first and second inductors to change the inductance value of the primary circuit.

11. The variable-gain amplifier circuit according to claim 2,
wherein the input matching circuit includes a first capacitor and a second capacitor;
wherein a first terminal of the first capacitor is used as the input terminal of the input matching circuit, a second terminal of the first capacitor is connected to a first terminal of the second capacitor and is used as an output terminal of the input matching circuit, and a second terminal of the second capacitor is grounded;
wherein the conductor circuit includes a first n-type bipolar transistor, a first resistor, and a first inductor, a base of the first n-type bipolar transistor being used as an input terminal of the conductor circuit;
wherein a collector of the first n-type bipolar transistor is used as an output terminal of the conductor circuit;
wherein a first terminal of the first inductor is connected to an emitter of the first n-type bipolar transistor, and a second terminal of the first inductor is grounded;
wherein a first terminal of the first resistor is connected to the base of the first n-type bipolar transistor, and a second terminal of the first resistor is used as a bias terminal of the conductor circuit;
wherein the output matching circuit includes a third capacitor and a fourth capacitor;
wherein a first terminal of the third capacitor is used as an input terminal of the output matching circuit, a second terminal of the third capacitor is connected to a first terminal of the fourth capacitor and is used as the output terminal of the output matching circuit, and a second terminal of the fourth capacitor is grounded; and
wherein the stabilization circuit includes a second resistor and a fifth capacitor, a first terminal of the second resistor being connected to the output terminal of the conductor circuit, a second terminal of the second resistor being connected to a first terminal of the fifth capacitor, and a second terminal of the fifth capacitor being grounded.

12. A variable-gain amplifier circuit comprising:
a pair of input matching circuits that generates a predetermined matching impedance for a preceding output stage;
a differential conductor circuit that outputs a differential current proportional to conductance with respect to input voltages applied through the pair of input matching circuits and voltages between reference voltage terminals and the differential conductor circuit;
two differential variable-load circuits each capable of converting a differential input current applied to the differential conductor circuit to a differential voltage signal and controlling a conversion factor for the current-to-voltage conversion;
a pair of output matching circuits that is connected to the two differential variable-load circuits to generate a predetermined matching impedance for an input impedance of a succeeding input stage; and
a pair of stabilization circuits that is connected to the two differential variable-load circuits to cause resistive power loss within a specific frequency range;
wherein the two differential variable-load circuits each include three reactance function elements, at least one of the three reactance function elements being capable of changing a reactance value thereof; and
wherein an input terminal of each of the pair of input matching circuits is used as an input terminal of the variable-gain amplifier circuit, and an output terminal of each of the pair of output matching circuits is used as an output terminal of the variable-gain amplifier circuit.

13. The variable-gain amplifier circuit according to claim 12,
wherein the pair of input matching circuits comprise first and second input matching circuits, each having an input terminal and an output terminal and generating a predetermined matching impedance for the impedance of the preceding output stage at the input terminal;
wherein the differential conductor circuit outputs, from a differential output terminal thereof, the differential current;
wherein the pair of output matching circuits comprise first and second output matching circuits, each having an input terminal and an output terminal, and being connected to respective differential input terminals of the differential variable-load circuits, and generating a predetermined matching impedance for an input impedance of a succeeding input stage at the output terminal;
wherein the pair of stabilization circuits comprise a first and a second stabilization circuit that are connected to a differential input terminal of the first differential variable-load circuit to cause resistive power loss within a specific frequency range; and
wherein the input terminals of the first and second input matching circuits are used as a differential input terminal of the variable gain amplifier circuit, and the output terminals of the first and second output matching circuits are used as a differential output terminal of the variable gain amplifier circuit.

14. A wireless communication device integrated circuit equipped with an amplifier, comprising:
a reception path and a transmission path, which are both formed on an RF chip; and
the amplifier, wherein the amplifier includes:
an input matching circuit that generates a predetermined matching impedance for a preceding output impedance;
a conductor circuit that outputs a current proportional to conductance with respect to an input voltage applied through the input matching circuit and a voltage between a reference voltage terminal and the conductor circuit;
at least one variable-load circuit having a function for converting an input current applied to the conductor circuit to a voltage signal and capable of controlling a conversion factor for the current-to-voltage conversion;
an output matching circuit that is connected to the variable-load circuit to generate a predetermined matching impedance for a succeeding input impedance; and
a stabilization circuit that is connected to the variable-load circuit to cause resistive power loss within a specific frequency range;
wherein the variable-load circuit includes three reactance function elements, at least one of the three reactance function elements being capable of changing a reactance value thereof;
wherein an input terminal of the input matching circuit is used as an input terminal of the amplifier, and an output terminal of the output matching circuit is used as an output terminal of the amplifier;
wherein the reception path includes a low-noise amplifier circuit, a mixer, a filter, an IF amplifier, a demodulator, and a local oscillator;
wherein the transmission path includes a modulator, an IF amplifier, a filter, a mixer, a driver amplifier, and a local oscillator;
wherein at least one of the low-noise amplifier circuit and the driver amplifier is an amplifier having the variable-load circuit; and
wherein a gain of the amplifier having the variable-load circuit is controlled based on a signal amplitude of a baseband signal processing circuit of the wireless communication device integrated circuit.

* * * * *